(12) United States Patent
Liang et al.

(10) Patent No.: US 11,688,724 B2
(45) Date of Patent: Jun. 27, 2023

(54) DISPLAY BACKPLATE AND METHOD FOR MANUFACTURING SAME, DISPLAY PANEL AND METHOD FOR MANUFACTURING SAME, AND DISPLAY DEVICE

(71) Applicant: BOE Technology Group Co., Ltd., Beijing (CN)

(72) Inventors: Zhiwei Liang, Beijing (CN); Wenqian Luo, Beijing (CN); Yingwei Liu, Beijing (CN); Ke Wang, Beijing (CN); Qi Yao, Beijing (CN); Huijuan Wang, Beijing (CN); Haixu Li, Beijing (CN); Zhanfeng Cao, Beijing (CN); Guangcai Yuan, Beijing (CN); Xue Dong, Beijing (CN); Guoqiang Wang, Beijing (CN); Zhijun Lv, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 87 days.

(21) Appl. No.: 16/765,530

(22) PCT Filed: May 31, 2019

(86) PCT No.: PCT/CN2019/089543
§ 371 (c)(1),
(2) Date: May 20, 2020

(87) PCT Pub. No.: WO2020/237629
PCT Pub. Date: Dec. 3, 2020

(65) Prior Publication Data
US 2021/0407976 A1    Dec. 30, 2021

(51) Int. Cl.
*H01L 25/16* (2023.01)
*H01L 27/12* (2006.01)
*H01L 23/00* (2006.01)

(52) U.S. Cl.
CPC ............ *H01L 25/167* (2013.01); *H01L 24/13* (2013.01); *H01L 27/124* (2013.01);
(Continued)

(58) Field of Classification Search
CPC ..... H01L 25/167; H01L 24/13; H01L 27/124; H01L 2224/13016; H01L 2224/13083;
(Continued)

(56) References Cited

U.S. PATENT DOCUMENTS

2008/0017873 A1    1/2008  Tomoda et al.
2017/0048976 A1*   2/2017  Prevatte ................. H01L 24/08
(Continued)

FOREIGN PATENT DOCUMENTS

CN    106876552 A    6/2017
CN    109755376 A    5/2019

OTHER PUBLICATIONS

International search report of PCT application No. PCT/CN2019/089543 dated Feb. 5, 2020.

*Primary Examiner* — Didarul A Mazumder
(74) *Attorney, Agent, or Firm* — Lippes Mathias LLP

(57) ABSTRACT

Provided is a display backplate including an array substrate and a plurality of pairs of connection structures on the array substrate, wherein the array substrate includes a plurality of thin-film transistors and a common electrode signal line, wherein at least one of the plurality of thin-film transistors is connected to one of a pair of connection structures and the common electrode signal line is connected to the other of the pair of connection structures; and an area of a first section of the connection structure is negatively correlated with a distance between the first section and a surface of the array substrate, and the first section is parallel to the surface of the array substrate.

18 Claims, 19 Drawing Sheets

(52) U.S. Cl.
CPC ............... *H01L 2224/13016* (2013.01); *H01L 2224/1319* (2013.01); *H01L 2224/13083* (2013.01); *H01L 2224/13124* (2013.01); *H01L 2224/13147* (2013.01)

(58) Field of Classification Search
CPC . H01L 2224/13124; H01L 2224/13147; H01L 2224/1319
USPC ..... 257/72; 438/48, 128, 149, 151, 157, 283
See application file for complete search history.

(56) References Cited

U.S. PATENT DOCUMENTS

| | | | |
|---|---|---|---|
| 2017/0287789 A1* | 10/2017 | Bower | ................ H01L 27/1266 |
| 2018/0042110 A1* | 2/2018 | Cok | ..................... H01L 21/481 |
| 2018/0247584 A1 | 8/2018 | Chen | |

* cited by examiner

DISPLAY BACKPLATE AND METHOD FOR MANUFACTURING SAME, DISPLAY PANEL AND METHOD FOR MANUFACTURING SAME, AND DISPLAY DEVICE

The present application is a 371 of PCT/CN2019/089543, filed May 31, 2019, the contents of which are incorporated herein in their entirety.

TECHNICAL FIELD

The present disclosure relates to the field of display technologies, and in particular, relates to a display backplate and a method for manufacturing the same, a display panel and a method for manufacturing the same, and a display device.

BACKGROUND

The micro light-emitting diode (micro-LED) display technology refers to such a technology that an LED is shrunk to a size below 100 μm and manufactured into a display panel. The micro-LED display panel has various advantages such as high brightness, high contrast, ultra-high resolution and color saturation, long service life, high response speed, energy saving, and high adaptability to a wide range of environments.

In the process of manufacturing the micro-LED display panel, a display backplate and the micro-LED need to be separately manufactured, and then the display backplate and the micro-LED are bonded to each other.

SUMMARY

Embodiments of the present disclosure provides a display panel and a method for manufacturing the same, and a display device.

At least one embodiment of the present disclosure provides a display backplate. The display backplate includes:

an array substrate and a plurality of pairs of connection structures on the array substrate, wherein the array substrate includes a plurality of thin-film transistors and a common electrode signal line, wherein at least one of the plurality of thin-film transistors is connected to one of a pair of connection structures and the common electrode signal line is connected to the other of the pair of the connection structures; and an area of a first section of the connection structure is negatively correlated with a distance between the first section and a surface of the array substrate, and the first section is parallel to the surface of the array substrate.

As one implementation of embodiments of the present disclosure, the connection structure is made of any one or an alloy of copper and aluminum.

As one implementation of embodiments of the present disclosure, the connection structure includes a main body portion and a conductive portion, wherein the conductive portion is disposed on a surface of the main body portion distal from the array substrate;

an orthographic projection of the main body portion on the array substrate falls within an orthographic projection of the conductive portion on the array substrate;

the conductive portion is conformal to a surface of the main body portion distal from the array substrate; and the main body portion is made of an insulating material.

Optionally, a difference between the thicknesses of the conductive portion at any positions is less than a predetermined value.

Optionally, the conductive portion is made of any one of or an alloy of copper and aluminum.

Optionally, the main body portion includes an organic insulating portion and an inorganic insulating portion, wherein the inorganic insulating portion is disposed between the organic insulating portion and the conductive portion.

Optionally, the maximum distance between the connection structure and the array substrate is in the range of between 3 micrometers and 5 micrometers.

Optionally, the connection structure is disposed on a first side of the array substrate; the display backplate further includes a pad disposed on a second side of the array substrate; and the second side is opposite to the first side.

Optionally, the display backplate further includes a package layer, wherein the pad is disposed between the array substrate and the package layer.

Optionally, the display backplate further includes a base disposed on the surface of the array substrate, wherein the base includes recesses in one-to-one correspondence with the connection structures; an area of a second section of the recess is negatively correlated with a distance between the second section and the surface of the array substrate; the second section is parallel to the surface of the array substrate; and the connection structure is inside the corresponding recess.

Exemplarily, the base includes a substrate, a separable layer and a resin layer which are sequentially stacked, and the recess is disposed in the resin layer.

Exemplarily, the base includes a substrate, the recess is disposed in the substrate, and the display backplate further includes a separable layer disposed between the base and the connection structure.

Exemplarily, the separable layer is made of any one of an organic resin material and GaN.

At least one embodiment of the present disclosure provides a display device. The display device includes:

the display backplate according to any one of the described above, and a plurality of micro light-emitting diodes on the display backplate, wherein any one of the plurality of micro light-emitting diodes includes a first electrode and a second electrode, wherein the first electrode and the second electrode are respectively connected to a pair of connection structures.

Optionally, a material hardness of the connection structure is greater than a material hardness of the first electrode and the second electrode.

Optionally, a surface, in contact with the connection structure, of the first electrode or the second electrode is provided with a protrusion surrounding the connection structure.

At least one embodiment of the present disclosure provides a display device. The display device includes the display panel according to any one of the described above, At least one embodiment of the present disclosure provides a method for manufacturing a display backplate. The method includes:

forming a plurality of pairs of connection structures; and forming an array substrate, on which the plurality of pairs of connection structures is disposed, wherein the array substrate includes a plurality of thin-film transistors and a common electrode signal line, wherein at least one of the plurality of thin-film transistors is connected to one of a pair of connection structures and the common electrode signal line is connected to the other of the pair of connection structures; and an area of a first section of the connection structure is negatively correlated with a distance between the first section and a surface of the array substrate, and the first section is parallel to the surface of the array substrate.

Optionally, forming the plurality of pairs of connection structures includes:

providing a base;

forming a recess on one side of the base, wherein an area of a second section of the recess is negatively correlated with a distance between the second section and the surface of the array substrate, and the second section is parallel to the surface of the array substrate; and forming the connection structure at least in the recess.

As one implementation of embodiments of the present disclosure, forming the connection structure at least in the recess includes:

forming a seed layer in the recess; and forming a metal-plated layer on the seed layer.

As one implementation of embodiments of the present disclosure, forming the connection structure at least in the recess includes:

sequentially forming a conductive portion and a main body portion in the recess, wherein an orthographic projection of the main body portion on the array substrate falls within an orthographic projection of the conductive portion on the array substrate;

the conductive portion is conformal to a surface of the main body portion distal from the array substrate; and the main body portion is made of an insulating material.

Optionally, the method further includes:

removing the base.

Exemplarily, the base includes a substrate, a separable layer, and a resin layer which are sequentially stacked, wherein the recess is disposed in the resin layer; and removing the base includes:

separating the substrate and the separable layer from the resin layer; and removing the resin layer.

Exemplarily, the base includes a substrate, and the recess is disposed in the substrate; the display backplate further includes a separable layer disposed between the base and the connection structure; and removing the base includes:

separating the substrate and the separable layer from the connection structure.

Exemplarily, the separable layer is made of an organic resin material; and separating the substrate and the separable layer from the connection structure includes:

separating the substrate and the separable layer from the organic resin layer with a mechanical force; or the separable layer is made of GaN; and separating the substrate and the separable layer from the connection structure includes:

performing laser irradiation to decompose the separable layer, such that the substrate is separated from the connection structure.

At least one embodiment of the present disclosure provides a method for manufacturing a display panel. The method includes:

providing any display backplate as described above;

transferring a plurality of micro-LEDs onto the display backplate at the same time, wherein any one of the plurality of micro-LEDs includes a first electrode and a second electrode, wherein the first electrode and the second electrode are connected to a pair of connection structures respectively.

Optionally, transferring the plurality of micro-LEDs onto the display backplate at the same time includes:

coating the display backplate with a layer of resin material doped with a solvent;

transferring the plurality of micro-LEDs onto the resin material at the same time with a mass transferring technique, wherein the first electrode and the second electrode of the micro-LED are in contact with the connection structures; and heating the resin material to solidify the resin material, such that the first electrode and the second electrode of the micro light-emitting diode are connected to the connection structures.

DETAILED DESCRIPTION

For clearer descriptions of the objects, technical solutions and advantages in the embodiments of the present disclosure, the present disclosure is described in detail below in combination with the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

Generally, a bonding process of a display backplate and a micro-LED includes the following steps. Firstly, an inverted conical sharp groove is etched on a silicon wafer. Next, copper (Cu) conical tips are formed in the sharp groove. Subsequently, the micro-LED is transferred onto the silicon wafer with the conical tips using a transferring technique, wherein an N electrode and a P electrode of the micro-LED are aligned with the bottoms of the two conical tips respectively, and the bottom of the conical tip refers to an end, having a larger area, of the conical tip. Then, the first electrode and the second electrode of the micro-LED are welded to the conical tips respectively by eutectic welding, and the conical tips fixed to the micro-LED are separated from the silicon wafer by etching the silicon wafer. Finally, the micro-LED is transferred onto the display backplate by a transferring process, and the conical tips are aligned with and form solid electrical connection with the first electrode and the second electrode of the display backplate.

In the related art, the first electrode and the second electrode of the micro-LED are aligned and connected to the bottoms of the conical tips. As the micro-LED in the micro-LED display panel has a small size (below 100 micrometers) and high density, there are high requirements on alignment when a plurality of micro-LEDs are connected to the bottoms of conical tips at the same time and thus the operation is difficult. Consequently, only one micro-LED is connected to the bottoms of the conical tips every time in the current bonding process. However, by taking a standard 4k (3840×2160) micro-LED display screen as an example, this standard 4k micro-LED display screen has 8,294,400 pixels in total, and 24,883,200 Micro-LED chips in total which are designed corresponding to red, green and blue (RGB) sub-pixels. If one micro-LED is bonded to conical tips every time, the time cost and manufacturing cost are very high. In addition, in the above micro-LED bonding process, the transferring process is used twice. As a result, the manufacturing process and the micro-LED display panel is complex and thus the time cost and manufacturing cost are very high. Due to the above two reasons, the current micro-LED bonding is not suitable for high-resolution and large-size display panels.

Figure 1:
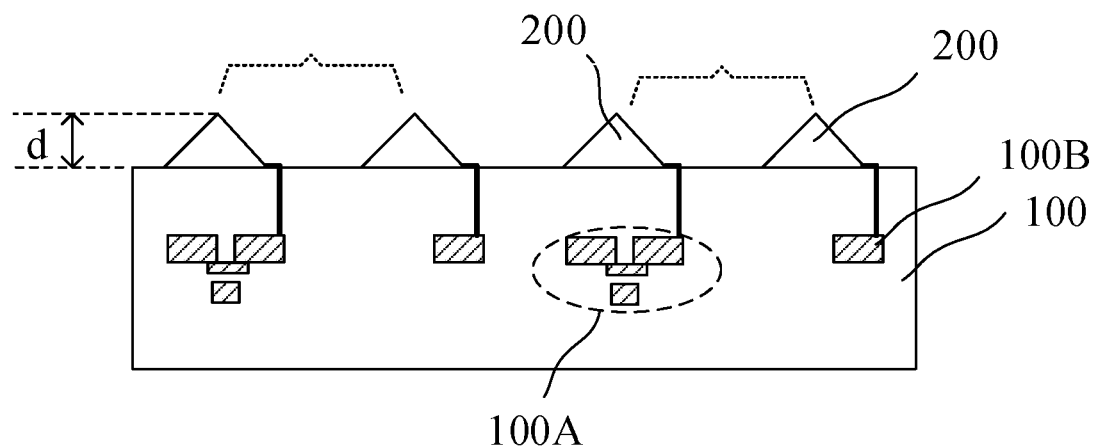
FIG. 1 is a structural diagram of a display backplate according to an embodiment of the present disclosure.

FIG. 1 is a structural diagram of a display backplate according to an embodiment of the present disclosure. With reference to FIG. 1, the display backplate includes an array substrate 100 and connection structures 200 disposed on the array substrate 100 in pairs. For example, two connection structures 200 in a brace in FIG. 1 are a pair. The area of a first section of the connection structure 200 is negatively correlated with a distance between the first section and the surface of the array substrate 100, and the first section is parallel to the surface of the array substrate 100. Negative correlation means that the farther the first section from the surface of the array substrate 100 is, the smaller the area of the first section is. The surface of the array substrate 100 is a surface on which the connection structure 200 is disposed, and the connection structure 200 protrudes from the surface of the array substrate 100.

With reference to FIG. 1, the array substrate 100 includes a plurality of thin-film transistors (TFT) 100A and a common electrode signal line 100B. At least one of the plurality of TFTs 100A is connected to one of a pair of connection structures 200; and the common electrode signal line 100B is connected to the other of the pair of the connection structures 200.

In the display backplate, the main body of the display backplate is the TFT base plate and the connection structure is disposed on one surface of the base plate. As the area of the first section of the connection structure is negatively correlated with the distance between the first section and the surface of the array substrate, namely, the connection structure has a protruding tip portion, and an orthographic projection of the tip portion on the array substrate falls within an orthographic projection of the bottom of the connection structure on the array substrate, the micro-LED is connected to the tip portion of the connection structure when the micro-LED is bonded to the display backplate. A gap between the tip portions of the connection structures is greater than a gap between the bottoms of the connection structures, such that when the connection structure is bonded to the micro-LED, even if there is a certain deviation, the electrical connection between the connection structure and the micro-LED may still be ensured, the requirements on alignment are low, and all micro-LEDs may be connected to the tip portions of the connection structures at the same time. Thus, the manufacturing process is simplified, and the time and manufacturing costs are reduced. In addition, as the connection structure is manufactured on the display backplate, all that is needed is to transfer the micro-LEDs onto the display backplate, such that the transferring process is used once. Thus, the manufacturing process is further simplified, and the time and manufacturing costs are further reduced. Therefore, the display backplate can be applied to high-resolution and large-size micro-LED display panels to achieve large-area, efficient and high-yield micro-LED bonding.

Figure 2:
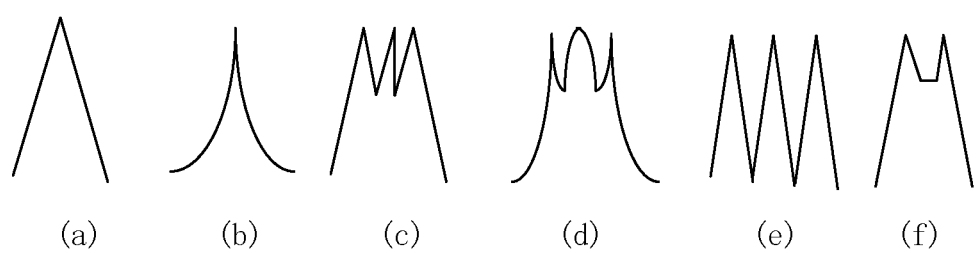
FIG. 2 is a diagram showing shapes of a connection structure according to the present disclosure.

FIG. 2 is a diagram showing shapes of a connection structure 200 according to the present disclosure. With reference to FIG. 2, in the embodiment of the present disclosure, the connection structure 200 may take a regular shape, for example, take the shape of a cone or a pyramid (as shown in (a) of FIG. 2) or take other irregular shapes (as shown in (b)-(f) of FIG. 2). For example, the connection structure shown in (b) of FIG. 2 takes the shape of a cone with an arc-shaped side and the connection structures shown in (c)-(f) of FIG. 2 each have a plurality of tip portions.

By taking the conical shape or the pyramidal shape as an example, the connection structure 200 is a conical tip and a tip portion of the conical tip protrudes along the direction distal from the array substrate 100. The conical tips are disposed in pairs, and each pair of conical tips includes a first conical tip and a second conical tip. The tip portion of the first conical tip is connected to a first electrode of the micro-LED, and the tip portion of the second conical tip is connected to a second electrode of the micro-LED.

In the embodiment of the present disclosure, as one implementation, the connection structure 200 is a connection structure integrally formed. At this time, the entire connection structure 200 is made of a conductive metal. For example, the connection structure is made of copper (Cu) or aluminum (Al). By manufacturing the connection structure with these two materials, high conductivity and mechanical strength may be ensured.

Figure 3:
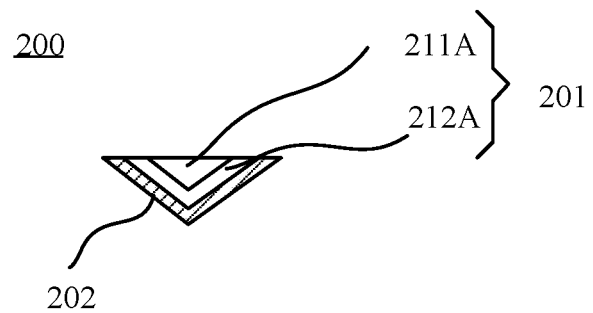
FIG. 3 is a structural diagram of a connection structure according to an embodiment of the present invention.

As another implementation, the connection structure 200 consists of two portions. FIG. 3 is a structural diagram of a connection structure according to an embodiment of the present invention. With reference to FIG. 3, the connection structure 200 includes a main body portion 201 and a conductive portion 202. The conductive portion 202 is disposed on the surface of the main body portion 201 distal from the array substrate 100. An orthographic projection of the main body portion 201 on the array substrate 100 falls within an orthographic projection of the conductive portion 202 on the array substrate 100. The conductive portion 202 is conformal to the surface of the main body portion 201 distal from the array substrate 100. The main body portion 201 is made of an insulating material.

The conductive portion 202 being conformal to the surface of the main body portion 201 distal from the array substrate 100 means that the shape of the surface of the main body portion 201 distal from the array substrate 100 is similar to the shape of the conductive portion 202. As shown in FIG. 3, both the surface of the main body portion 201 and the surface of the conductive portion 202 take conical shapes and these two conical shapes are similar.

In this implementation, although the connection structure 200 consists of two portions, such a connection structure 200 may likewise ensure the electrical connection effect and mechanical strength due to the cooperation of the conductive portion 202 and the main body portion 201.

With reference to FIG. 3, in this connection structure, a difference between the thicknesses of the conductive portion 202 at any positions is less than a predetermined value. For example, the conductive portion may have a thickness in the range of 100-500 nm, and the difference between the thicknesses of the conductive portion 202 at any positions is less than 10-25 nm, or less than ¹⁄₂₀-¹⁄₁₀ of the maximum thickness value of the conductive portion, that is, the thicknesses of the conductive portion 202 at any positions are basically the same. The conductive portion designed in this way is of a one-layer structure. As the thicknesses of the conductive portion at any positions are basically the same, the excellent conductivity of the conductive portion is ensured.

Exemplarily, in this connection structure, the conductive portion 202 is made of the same material as the above solid connection structure. For example, the conductive portion 202 is made of copper or aluminum. High conductivity and mechanical strength of the conductive portion may be ensured by manufacturing the conductive portion with copper or aluminum.

Exemplarily, in this connection structure, the main body portion 201 includes an organic insulating portion 211A and an inorganic insulating portion 212A. The inorganic insulating portion 212A is disposed between the organic insulating portion 211A and the conductive portion 202. By filling a hollow portion of metal with a combination of these materials, the connection structure 202 may be sufficiently supported, and in addition, the inorganic material may achieve better water and oxygen resistance. Moreover, the combination between metal and the inorganic material may be ensured by disposing the organic material between the metal and the inorganic material.

Exemplarily, the inorganic insulating portion 212A may be made of silicon oxide (SiO) and the organic insulating portion 211A may be made of polyimide (PI).

Exemplarily, the maximum distance (shown as d in FIG. 1) between the top of the connection structure 200 and the array substrate 100 is in the range from 3 micrometers to 5 micrometers, that is, the connection structure 202 may have a height in the range from 3 micrometers to 5 micrometers. By adopting the connection structure 202 with such a height range, the contact cooperation of the connection structure with the first electrode and the second electrode of the micro-LED may be achieved and thus the electrical connection effect is ensured.

Exemplarily, the connection structure 202 may have a height of 3 micrometers, and the connection structure 202 having the height of 3 micrometers may be in contact with the first electrode and the second electrode of the micro-LED.

Herein, the height of the connection structure 202 refers to a distance between the top of the protruding end of the connection structure and the surface of the array substrate.

In the embodiment of the present disclosure, the density of the connection structures 202, that is, the size and spacing of the bottoms of the connection structures may be determined according to the density of the micro-LEDs. Within the allowable density range of the micro-LEDs, it is ensured that the connection structures 202 have a sufficiently large size and spacing as soon far possible, thereby ensuring the high conductivity of the single connection structure 202 and the insulation between adjacent connection structures 202.

Figure 4:
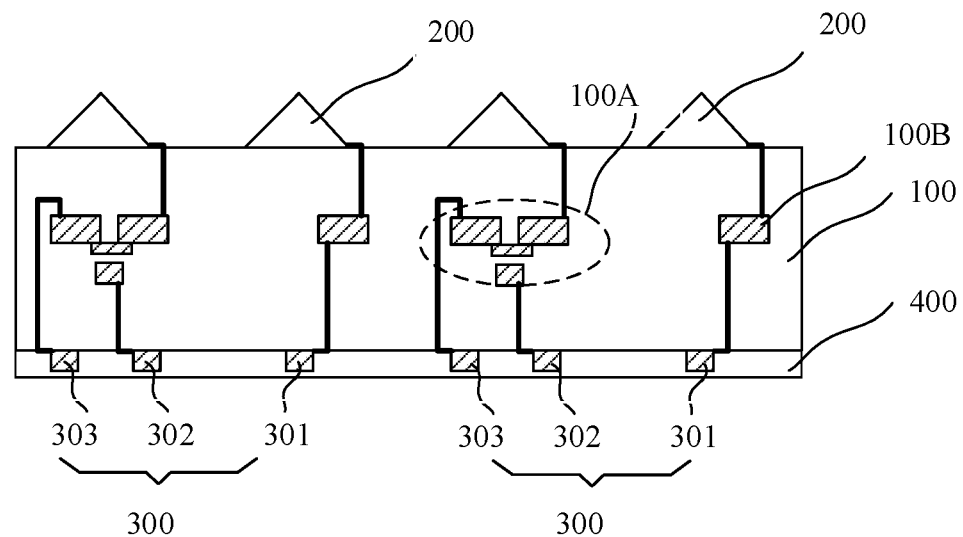
FIG. 4 is a structural diagram of another display backplate according to an embodiment of the present disclosure.

FIG. 4 is a structural diagram of another display backplate according to an embodiment of the present disclosure. With reference to FIG. 4, the connection structure 200 is disposed on a first side of the array substrate 100. The display backplate further includes a pad 300 disposed on a second side of the array substrate 100. The second side is opposite to the first side.

By disposing the pad, it is ensured that the array substrate may be bonded to other devices while being bonded to the micro-LEDs.

Exemplarily, the pad 300 may be an integrated circuit (IC) pad, such that the array substrate may be connected to an IC. Thus, a signal provided by the driving IC may be finally transmitted to the micro-LED through the TFT to drive the micro-LED to emit light.

Exemplarily, the pads 300 may be divided into a plurality of groups, and each group of pads 300 includes a common pad 301, a gate pad 302 and a data pad 303.

Each TFT 100A of the array substrate 100 corresponds to a pair of connection structures 200 and a group of pads.

For each TFT, a gate is connected to the corresponding gate pad, a source is connected to the corresponding data pad, and a drain is connected to one of the pair of connection structures 200. The common pad corresponding to each TFT is connected to the other of the pair of connection structures 200.

Optionally, with reference to FIG. 4, the display backplate may further include a package layer 400 (or protection layer (PVX)), and the pad 300 is disposed between the array substrate 100 and the package layer 400. The package layer 400 may protect the pad 300 before the display backplate is used, and may be removed when the display backplate is subsequently used. The package layer 400 may be made of an organic material such as resin.

Figure 5:
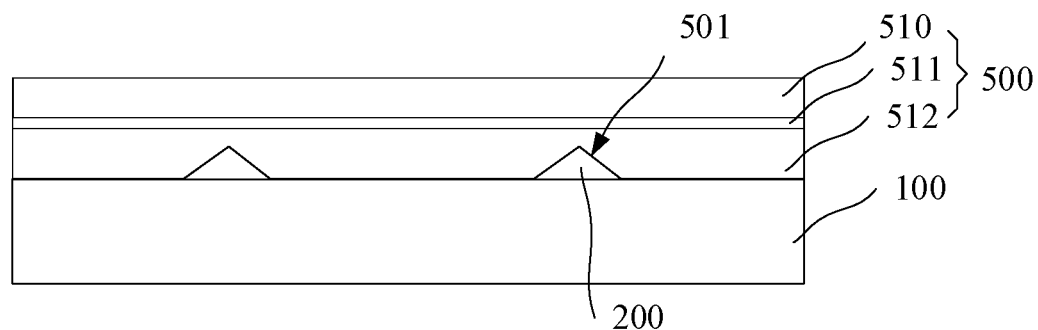
FIG. 5 is a structural diagram of still another display backplate according to an embodiment of the present disclosure.

FIG. 5 is a structural diagram of a further display backplate according to an embodiment of the present disclosure. With reference to FIG. 5, the display backplate further includes a base 500 disposed on the surface of the array substrate. The base 500 includes recesses 501 in one-to-one correspondence with the connection structures 200. The area of a second section of the recess 501 is negatively correlated with a distance between the second section and the surface of the array substrate. The second section is parallel to the surface of the array substrate 100, and the connection structure 200 is inside the recess.

Herein, the base 500 is a basis for manufacturing the connection structure 200, that is, the connection structure 200 is manufactured on the base 500. During manufacturing, the recess 501 matching the connection structure 200 in shape is manufactured firstly and then the connection structure 200 is manufactured in the corresponding recess 501. After the connection structure and the array substrate are manufactured, the base 500 may remain to protect the connection structure 200 before the display backplate is used, and may be removed when the display backplate is subsequently used.

With reference to FIG. 5, the base 500 may include a substrate 510, a separable layer 511, and a resin layer 512 which are sequentially stacked, and the recess 501 is disposed in the resin layer 512. In this implementation, the connection structure 200 is manufactured on the resin layer 512. During separation, the separable layer 511 is separated from the resin layer 512 firstly to peel off the separable layer 511 and the substrate 510, and then the resin layer 512 is removed.

Figure 6:
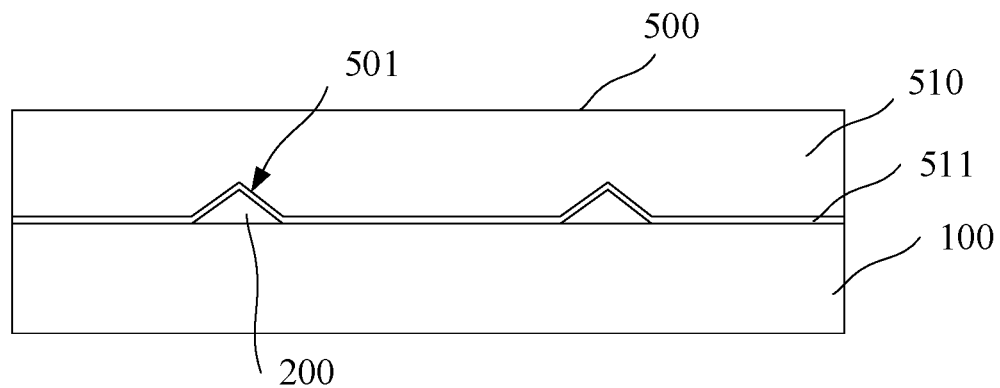
FIG. 6 is a structural diagram of yet still another display backplate according to an embodiment of the present disclosure.

FIG. 6 is a structural diagram of a still further display backplate according to an embodiment of the present disclosure. With reference to FIG. 6, the display backplate is provided with a base 500 of one structure. The base 500 includes a substrate 510. The recess 501 is disposed in the substrate 510. The display backplate further includes a separable layer 511 between the base 500 and the connection structure 200. In this implementation, the connection structure 200 is manufactured on the substrate 510. During separation, the separable layer 511 is directly separated from the connection structure 200 to peel off the separable layer 511 and the substrate 510.

In the display backplates shown in FIGS. 5 and 6, the substrate 510 may be made be of glass.

In the display backplates shown in FIGS. 5 and 6, the separable layer 511 may be made of any one of an organic resin material and gallium nitride (GaN).

When the organic resin material is used, as the adhesion of the organic resin material to the glass is greater than the adhesion of the organic resin material to resin or metal, the substrate and the separable layer may be separated with a mechanical force. When GaN is used, as the GaN layer is decomposed after laser irradiation, the substrate and the separable layer may be separated by laser irradiation.

Exemplarily, the organic resin material may be heat-resistant organic resin. For example, the organic resin material may be a mechanically dissociated adhesive (DBL). When the heat-resistant organic resin is used, the separable layer 511 has a thickness equal to or greater than 50 nm.

In the embodiment of the present disclosure, the display backplate may include both the package layer 400 and the base 500 above for protecting the pad and the connection structure at the same time. During use, the package layer 400 and the base 500 are removed.

Figure 7:
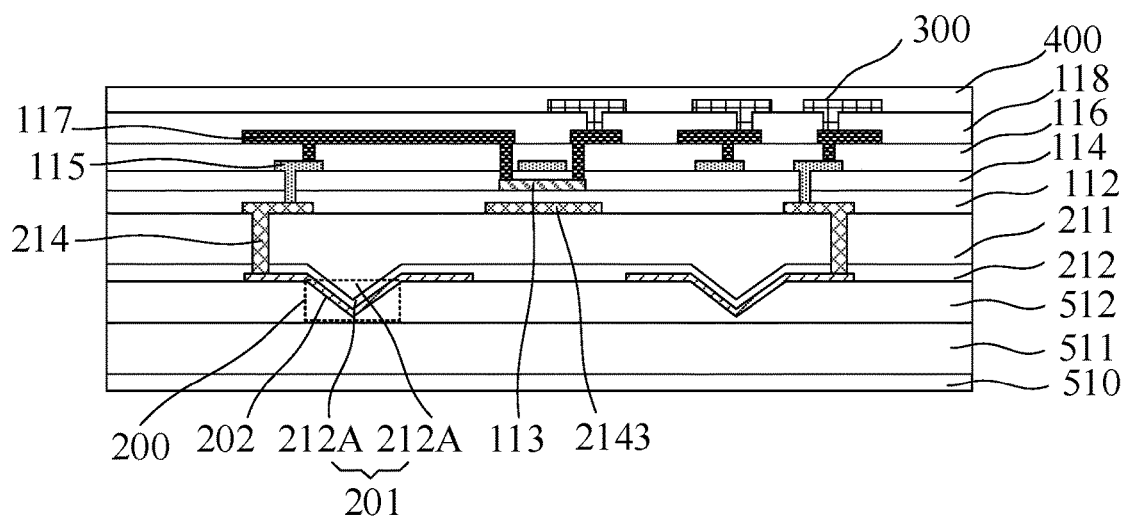
FIG. 7 is a structural diagram of yet still another display backplate according to an embodiment of the present disclosure.

FIG. 7 is a structural diagram of a still further display backplate according to an embodiment of the present disclosure. The structure of the array substrate 100 in the display backplate according to the present disclosure is described in detail below with reference to FIG. 7. The array substrate 100 may include a buffer layer 112, an active layer 113, a gate insulating layer 114, a gate layer 115, an interlayer insulating layer 116, a source-drain layer 117 and a planarization layer 118, which are sequentially stacked. The active layer 113, the gate insulating layer 114, the gate layer 115, the interlayer insulating layer 116 and the source-drain layer 117 constitute the above thin-film transistor 100A, and the above common electrode signal line 100B and the gate layer 115 are disposed on the same layer.

Exemplarily, the thin-film transistor 100A is a low temperature polysilicon (LTPS) thin-film transistor. The LTPS thin-film transistor has good current performance and is suitable for a current-driven micro-LED display panel. The LTPS thin-film transistor is usually of a top-gate structure (a structure that a gate of the thin-film transistor is above the active layer), as shown in FIG. 7. In other embodiments, the LTPS thin-film transistor may adopt a bottom-gate structure (a structure that the gate of the thin-film transistor is below the active layer).

Further, the array substrate 100 further includes a light-shielding portion 2143. The light-shielding portion 2143 is disposed between the connection structure 200 and the active layer 113. An orthographic projection of the active layer 113 on the base 500 falls within an orthographic projection of the light-shielding portion on the base 500. The light-shielding portion 2143 disposed in such a way is configured to shield light to prevent the light from irradiating the active layer 113.

Further, the array substrate 100 further includes a first wiring layer 214 for connecting the gate layer 115 with the connection structure 200. The first wiring layer 214 includes source wiring and common electrode wiring. Both the source wiring and the common electrode wiring are connected to the conductive portion. The above light-shielding portion 2143 may be disposed on the first wiring layer 214.

Further, the array substrate 100 further includes an inorganic insulating layer 212 and an organic insulating layer 211. The organic insulating layer 211 is disposed between the first wiring layer 214 and the inorganic insulating layer 212. Herein, the organic insulating layer 211 may exert a planarization effect, and further achieve a support effect by filling the recess, such that the entire connection structure is more secure. The organic insulating portion 211A above is disposed on the organic insulating layer 211, and the organic insulating portion 211A is a portion of the organic insulating layer 211 protruding from the surface of the array substrate. The inorganic insulating portion 212A is disposed on the inorganic insulating layer 212, and the inorganic insulating portion 212A is a portion of the inorganic insulating layer 212 protruding from the surface of the array substrate.

Exemplarily, the gate layer 115 includes a gate, a gate line, a common electrode signal line, and source wiring. The gate is connected to the gate line. The common electrode signal line is connected to the common electrode wiring, and the source wiring is connected to the source wiring of the first wiring layer 214.

Exemplarily, the source-drain layer 117 includes a source, a drain, a gate wiring and a common electrode wiring. The source and the drain are connected to the active layer 113. The source is also connected to the source wiring of the gate layer 115. The gate wiring is connected to the gate line of the gate layer 115, and the common electrode wiring is connected to the common electrode signal line of the gate layer 115.

Figure 8:
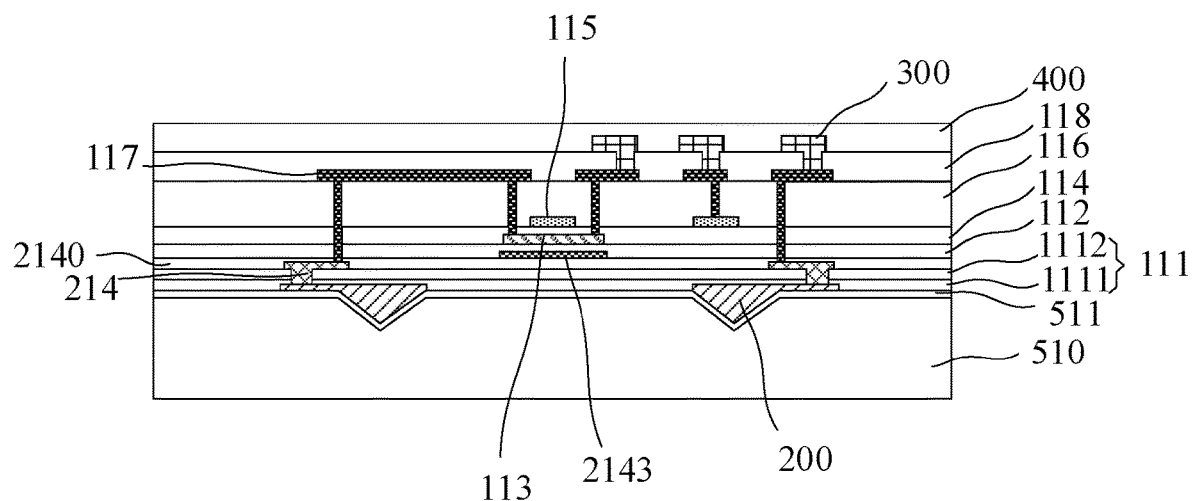
FIG. 8 is a structural diagram of yet still another display backplate according to an embodiment of the present disclosure.

FIG. 8 is a structural diagram of a still further display backplate according to an embodiment of the present disclosure. The structure of the display backplate shown in FIG. 8 mainly differs from the structure of the display backplate shown in FIG. 7 in that the designs of the base plate, the connection structure, the film layer of thin-film transistors, the wiring, and the light-shielding portion are different.

Herein, the differences between the bases and the connection structures have been described above. The design differences between the film layers of the thin-film transistors, the wiring, and the light-shielding portions are described below.

The array substrate 100 may include an isolating layer 111, an insulating layer 2140, a buffer layer 112, an active layer 113, a gate insulating layer 114, a gate layer 115, an interlayer insulating layer 116, a source-drain layer 117, and a planarization layer 118, which are sequentially stacked. The active layer 113, the gate insulating layer 114, the gate layer 115, the interlayer insulating layer 116, and the source-drain layer 117 constitute the thin-film transistor 100A, and the common electrode signal line 100B and the source-drain layer 117 are disposed on the same layer.

Further, the array substrate 100 further includes a first wiring layer 214. The first wiring layer 214 includes a source wiring and a common electrode wiring 2142. Both the source wiring and the common electrode wiring are connected to the connection structure.

Exemplarily, the gate layer 115 includes a gate and a gate line. The gate is connected to the gate line.

Exemplarily, the source-drain layer 117 includes a source, a drain, gate wiring and a common electrode signal line. The source and the drain are connected to the active layer 113. The source is also connected to the source wiring of the first wiring layer 214. The gate wiring is connected to the gate line of the gate layer 115, and the common electrode signal line is connected to the common electrode wiring of the first wiring layer 214.

In the structure shown in FIG. 8, the light-shielding portion 2143 is designed independently and is disposed between the isolating layer 111 and the insulating layer 2140.

In addition to different film layer structures, FIGS. 7 and 8 also differ in wiring design. In the display backplate shown in FIG. 7, it needs to form via holes four times: a via hole below the first wiring layer 214, a via hole below the gate layer 115, a via hole below the source-drain electrode layer 117 and a via hole below the pad 300. In the display backplate shown in FIG. 8, via holes only need to be formed at three times: a via hole below the first wiring layer 214, a via hole below the source-drain electrode layer 117 and a via hole below the pad 300.

Exemplarily, in FIGS. 7 and 8 according to the embodiment of the present disclosure, the gate layer and the first wiring layer may be molybdenum (Mo) layers and the source-drain electrode layer and the pad may adopt a Ti/Al/Ti (titanium) stack structure.

The film layer structures shown in FIGS. 7 and 8 according to the embodiment of the present disclosure are only examples. The film layer structure may be adjusted as long as the same effect can be achieved.

Figure 9:
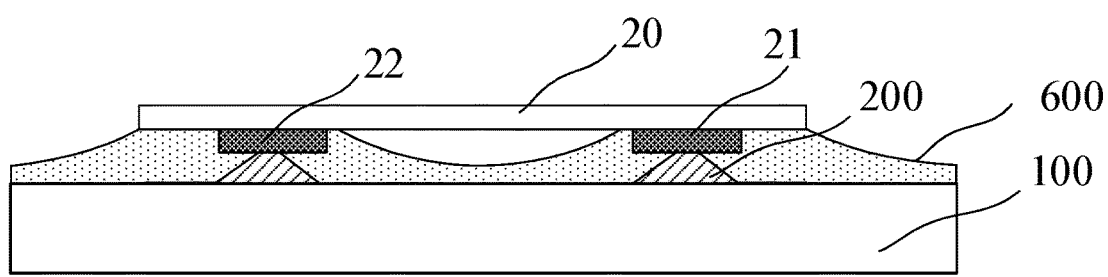
FIG. 9 is a structural diagram of a display panel according to an embodiment of the present disclosure.

FIG. 9 is a structural diagram of a display panel according to an embodiment of the present disclosure. With reference to FIG. 9, the display panel includes: the display backplate 10 as shown in any one of FIGS. 1 to 8 and a plurality of micro-LEDs 20 on the display backplate 10 (FIG. 9 only shows one micro-LED as an example). Any one of the plurality of micro-LEDs 20 includes a first electrode 21 and a second electrode 22 which are connected to a pair of connection structures 200 respectively.

Herein, one of the first electrode 21 and the second electrode 22 is an N electrode and the other is a P electrode. Generally, the electrode connected to the common electrode signal line through the connection structure 200 is the N electrode and the electrode connected to the thin-film transistor through the connection structure 200 is the P electrode. When the display panel is in operation, the N electrodes of the various micro-LEDs 20 apply the same electrical signal under the control of the common electrode signal line, and the magnitude of the electrical signal of the P electrodes of different micro-LEDs 20 is determined based on the brightness that the micro-LED 20 needs to display, and the thin-film transistor is responsible for writing the electric signal of the P electrode.

With reference to FIG. 9, the display panel further includes a resin material layer 600 disposed between the connection structure 200 and the first and second electrodes of the micro-LED 20. The resin material layer 600 is configured to enhance the connection between the connection structure 200 and the first and second electrodes of the micro-LED 20.

Exemplarily, the resin material layer 600 may be made of an epoxy resin or the like.

As one implementation of the embodiment of the present disclosure, the material hardness of the connection structure 200 is greater than the material hardness of the first electrode 21 and the second electrode 22. In this implementation, the material hardness of the connection structure is greater than the material hardness of the first electrode and the second electrode, such that the connection structure may be pierced into the electrode, and thus the effects of electrical connection and mechanical connection between the connection structure and the electrodes are better.

Exemplarily, the connection structure 200 is made of copper or aluminum, and the first electrode 21 and the second electrode 22 may be made of indium (In). The hardness of indium is less than that of copper or aluminum, such that the connection structure may be pierced into the electrode.

Figure 10:
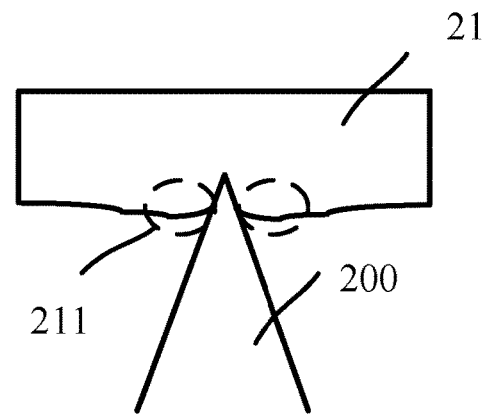
FIG. 10 is a diagram showing a contact surface between first and second electrodes and a connection structure according to an embodiment of the present disclosure.

FIG. 10 is a diagram showing a contact surface between first and second electrodes and a connection structure according to an embodiment of the present disclosure. With reference to FIG. 10, when the material hardness of the connection structure 200 is greater than the material hardness of the first electrode 21 and the second electrode 22, the connection structure may be pierced into the first electrode 21 and the second electrode 22 to complete electrical connection. When the connection structure is pierced into the first electrode and the second electrode of the micro light-emitting diode, the surface, in contact with the connection structure 200, of the first electrode 21 or the second electrode 22 has a protrusion 211 surrounding the connection structure 200.

In this implementation, the connection structure 200 is pierced into the first electrode 21 or the second electrode 22 to form the protrusion 211, such that the effects of electrical connection and mechanical connection between the connection structure 200 and the electrode are better.

As another implementation of the embodiment of the present disclosure, the material hardness of the connection structure 200 may be less than or equal to the material hardness of the first electrode 21 and the second electrode 22. For example, the connection structure 200 may be made of the same material as the first electrode 21 and the second electrode 22.

An embodiment of the present disclosure further provides a display device including the display panel as described above.

In specific implementation, the display device according to the embodiment of the present disclosure may be any product or component having a display function, such as a mobile phone, a tablet computer, a television, a display, a laptop computer, a digital photo frame, or a navigator.

Figure 11:
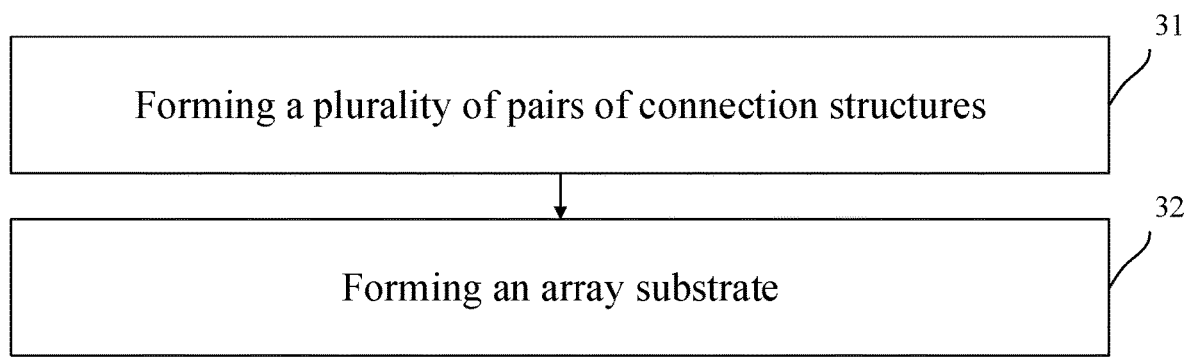
FIG. 11 is a flowchart of a method for manufacturing a display backplate method according to an embodiment of the present disclosure.

FIG. 11 is a flowchart of a display backplate manufacturing method according to an embodiment of the present disclosure. The method is used for manufacturing the display backplate as shown in any one of FIGS. 1 to 8. With reference to FIG. 11, the method includes the following steps.

In step 31, a plurality of pairs of connection structures are formed.

In step 32, an array substrate is formed, on which the plurality of pairs of connection structures is disposed, wherein the array substrate includes a plurality of thin-film transistors and a common electrode signal line, wherein at least one of the plurality of thin-film transistors is connected to one of a pair of connection structures and the common electrode signal line is connected to the other of the pair of connection structures.

Herein, the area of a first section of the connection structure is negatively correlated with a distance between the first section and the surface of the array substrate, and the first section is parallel to the surface of the array substrate.

Step 31 of forming the plurality of pairs of connection structures may include: providing a base; forming a recess on one side of the base, wherein the area of a second section of the recess is negatively correlated with a distance between the second section and the surface of the array substrate, and the second section is parallel to the surface of the array substrate; and the connection structure is at least formed in the recess. In this implementation, the recess is manufactured firstly for facilitating the manufacturing of the connection structure.

As one implementation of the embodiment of the present disclosure, the step of forming the connection structure at least in the recess includes: forming a seed layer i in the recess; and forming a metal-plated layer on the seed layer. In this implementation, a solid connection structure may be manufactured by electroplating.

As another implementation of the embodiment of the present disclosure, the step of forming the connection structure at least in the recess includes: sequentially forming a conductive portion and a main body portion in the recess, wherein an orthographic projection of the main body portion on the array substrate falls within an orthographic projection of the conductive portion on the array substrate, the conductive portion is conformal to the surface of the main body portion distal from the array substrate, and the main body portion is made of an insulating material. In the present disclosure, the connection structure may consist of two portions, and the connection structure consisting of two portions may likewise ensure the electrical connection effect and mechanical strength.

Optionally, the method further includes: the base is removed. By removing the base, the display backplate may be directly bonded to the micro-LED when the display backplate is used subsequently.

As one implementation of the embodiment of the present disclosure, the base includes a substrate, a separable layer, and a resin layer which are sequentially stacked, and the recess is disposed in the resin layer. The step of removing the base includes:

separating the substrate and the separable layer from the resin layer; and removing the resin layer.

In this implementation, the connection structure is manufactured on the resin layer. During separation, the separable layer is separated from the resin layer firstly, and the resin layer is removed.

Herein, the resin layer may be removed by dry etching.

As another implementation of the embodiment of the present disclosure, the base includes a substrate, and the recess is disposed in the substrate. The display backplate further includes a separable layer disposed between the base and the connection structure. The step of removing the base includes:

separating the substrate and the separable layer are from the connection structure.

In this implementation, the connection structure is manufactured on the substrate. During separation, the separable layer is directly separated from the connection structure.

Exemplarily, the separable layer is made of an organic resin material. The step that the substrate and the separable layer are separated from the connection structure includes:

the substrate and the separable layer are separated from the resin layer with a mechanical force.

Alternatively, the separable layer is made of GaN, and the step of separating the substrate and the separable layer from the connection structure includes:

performing laser irradiation to decompose the separable layer, such that the substrate is separated from the connection structure.

In this implementation, as the adhesion of the organic resin material layer to glass is greater than the adhesion of the organic resin material to resin or metal, the substrate and the organic resin material layer may be separated with the mechanical force.

As the GaN layer is decomposed after laser irradiation, the substrate may be separated by laser irradiation.

Figure 12:
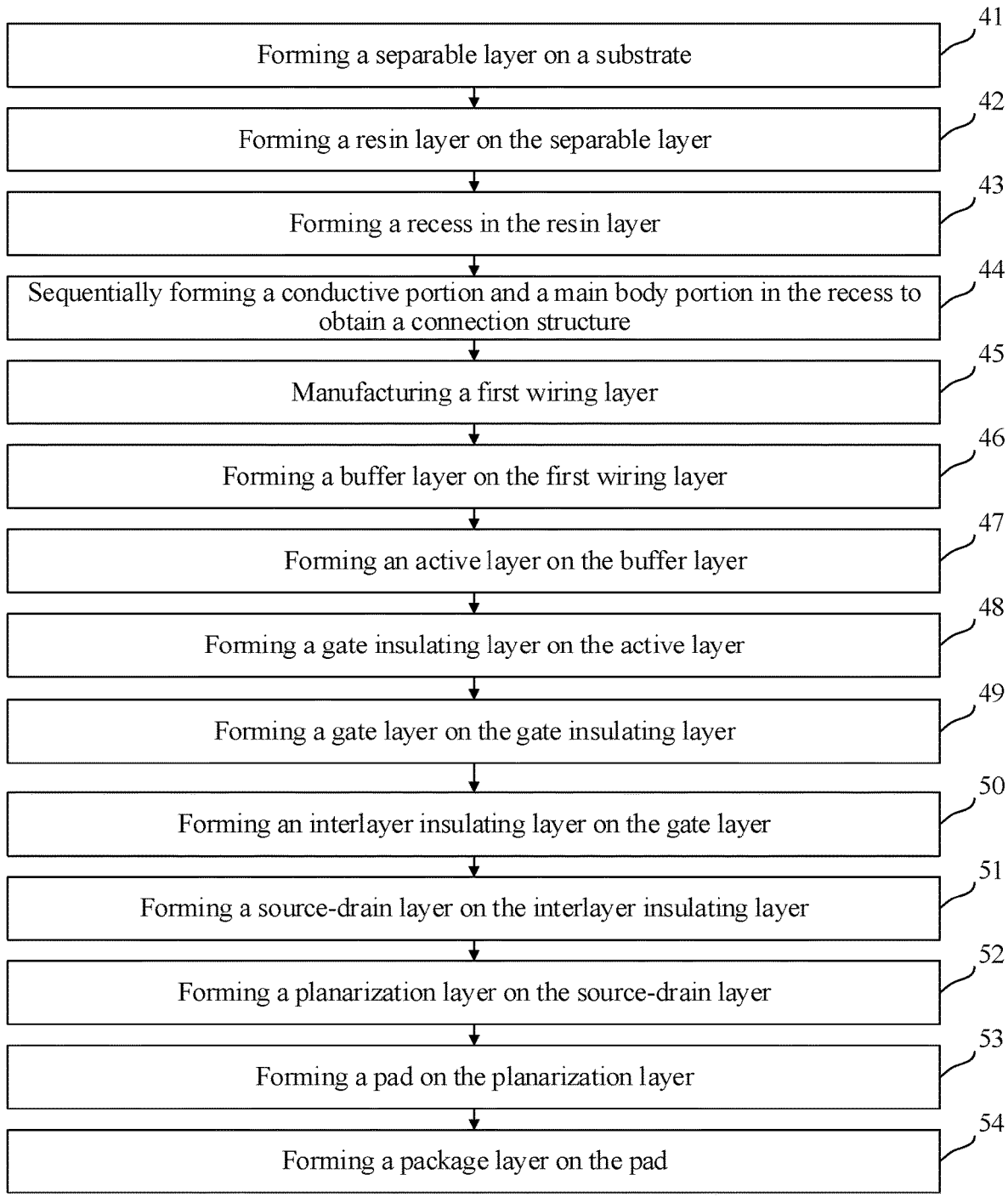
FIG. 12 is a flowchart of another method for manufacturing a display backplate according to an embodiment of the present disclosure.

FIG. 12 is a flowchart of another display backplate manufacturing method according to an embodiment of the present disclosure. The method is used for manufacturing the display backplate as shown in FIG. 7. With reference to FIG. 12, the method includes the following steps.

In step 41, a separable layer is formed on a substrate.

Figure 13:
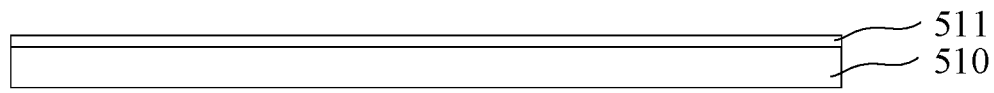
FIGS. 13 to 29 are diagrams showing processes of manufacturing the display backplate shown in FIG. 8 according to an embodiment of the present disclosure.

As shown in FIG. 13, the separable layer 511 is formed on the substrate 510. In the embodiment of the present disclosure, the substrate may be a glass substrate, and the separable layer 511 may be a mechanically dissociated adhesive (DBL). The adhesion of the mechanically dissociated adhesive to the glass substrate is greater than the adhesion of the mechanically dissociated adhesive to resin. The mechanically dissociated adhesive may be formed on the substrate by coating.

In step 42, a resin layer is formed on the separable layer.

Figure 14:
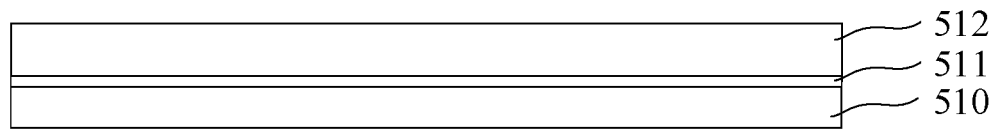

As shown in FIG. 14, the resin layer 512 is formed on the separable layer 511. The resin layer 512 is made of PI. The resin layer 512 may be formed on the separable layer by coating.

In step 43, a recess is formed in the resin layer.

Figure 15:
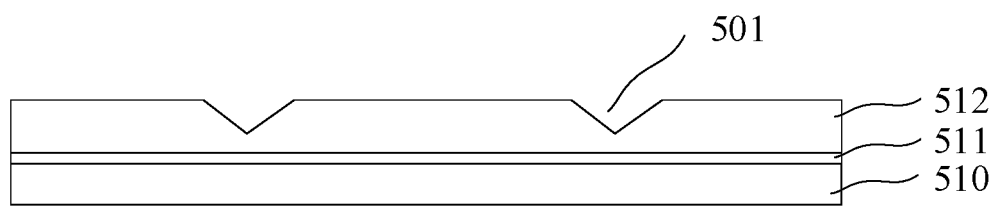

As shown in FIG. 15, the recess 501 is formed in the resin layer 512.

In the embodiment of the present disclosure, the connection structure is manufactured through PI via (TPV) technique. PI is a kind of polymer resin material. When the recess is formed, a photoresist (PR) may be used as an etching barrier layer, and the recess is formed by dry etching (such as inductively coupled plasma). In this process, the PR is used as the etching barrier layer. As the pattern of the PR itself has an inclination angle (θ) at the edges, the pattern etched may be conical by controlling an etched opening and height. The width d and height h of the etched opening should satisfy the following condition: d=2h/an (θ).

In step 44, a conductive portion and a main body portion are sequentially formed in the recess to obtain a connection structure.

An orthographic projection of the main body portion on the array substrate falls within an orthographic projection of the conductive portion on the array substrate. The conductive portion is conformal to the surface of the main body portion distal from the array substrate. The main body portion is made of an insulating material.

Figure 16:
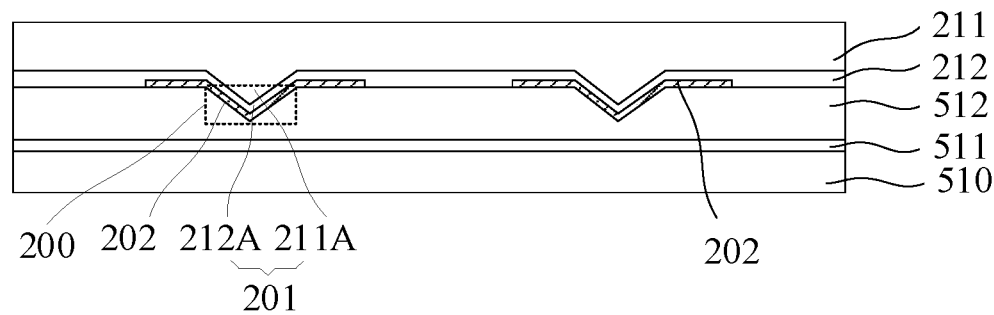

As shown in FIG. 16, the conductive portion 202 and the main body portion 201 are formed in the corresponding recess 501 and the conducive portion 202 and the main body portion 201 constitute the connection structure.

With reference to FIG. 16, herein, the main body portion 201 includes an organic insulating portion 211A and an inorganic insulating portion 212A. The inorganic insulating portion 212A is disposed between the organic insulating portion 211A and the conductive portion 202.

The conductive portion 202 has a shape similar to that of the inner side wall of the recess 501. The conductive portion 202 may be made of copper, aluminum, or the like by magnetron sputtering and patterning. The conductive portion 202 has a specific thickness and may cover the inner side wall of the recess 501. Exemplarily, the conductive portion may also be manufactured by electroplating. For example, a seed layer is manufactured firstly and the seed layer is electroplated to form a metal-plated layer, thereby obtaining the conductive portion. Exemplarily, the seed layer is formed to have a thickness in the range from 1 nm to 10 nm. Exemplarily, any metal or alloy, which has relatively high adhesion to the separable layer and a relatively good ability to prevent the metal to be electroplated from diffusing may be used as a material for manufacturing the seed layer. Examples of suitable metal materials for manufacturing the seed layer include: copper, titanium, tantalum, chromium, titanium tungsten alloy, tantalum nitride, and titanium nitride. The metal-plated layer may be made of the same material as the seed layer. Exemplarily, when the seed layer is made of copper, if the metal-plated layer is made of copper, the seed layer and the metal-plated layer finally form an integrated structure. If the seed layer is made of other materials, the seed layer and the metal-plated finally form a double-layer structure.

The organic insulating portion 211A may be made of PI, and the inorganic insulating portion 212A may be made of SiO. During manufacturing, the inorganic insulating layer 212 may be formed firstly by deposition, and then the organic insulating layer 211 is formed by coating. Herein, the organic insulating layer 211 may play a role of planarization on the one hand, and play a role of supporting on the other hand by filling the recess, such that the entire connection structure is securer. The organic insulating portion 211A above is disposed on the organic insulating layer 211, and the organic insulating portion 211A is a portion of the organic insulating layer 211 protruding from the surface of the array substrate; and the inorganic insulating portion 212A is disposed on the inorganic insulating layer 212, and the inorganic insulating portion 212A is a portion of the inorganic insulating layer 212 protruding from the surface of the array substrate.

It should be noted that during the manufacturing of the conductive portion 202, a wiring connected to the conductive portion is also manufactured, which facilitates connection between the wiring subsequently manufactured and the conductive portion.

In step 45, a first wiring layer is manufactured.

Figure 17:
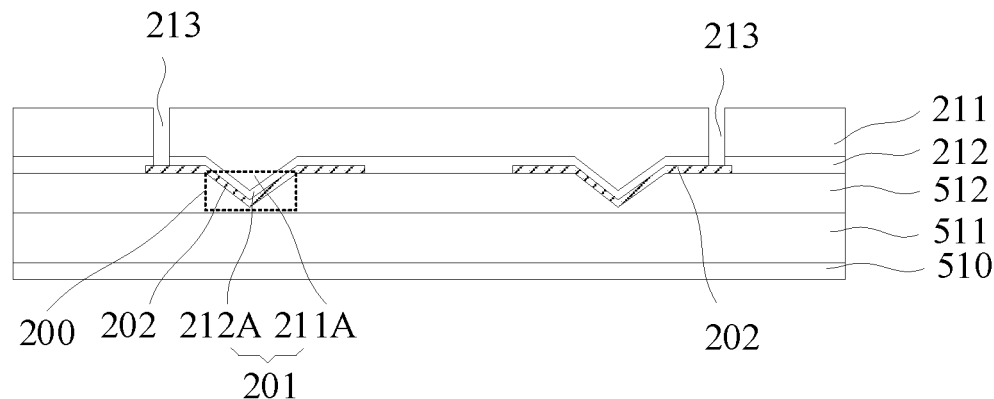
Figure 19:
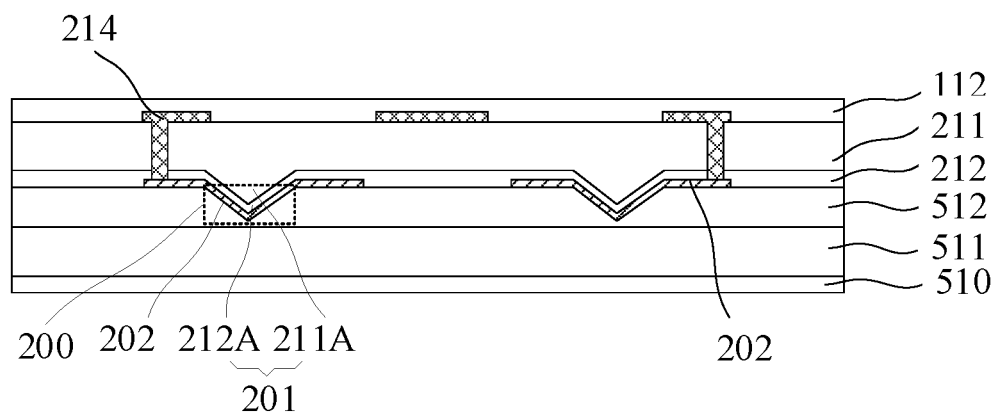

As shown in FIG. 17, a via hole 213 is formed in the organic insulating layer 211 and the inorganic insulating layer 212. As shown in FIG. 19, a layer of metal (such as a layer of molybdenum (Mo)) is formed on the organic insulating layer 211 and then patterning is performed to obtain the first wiring layer 214. The first wiring layer 214 is connected to the conductive portion 202 through the via hole 213.

Figure 18:
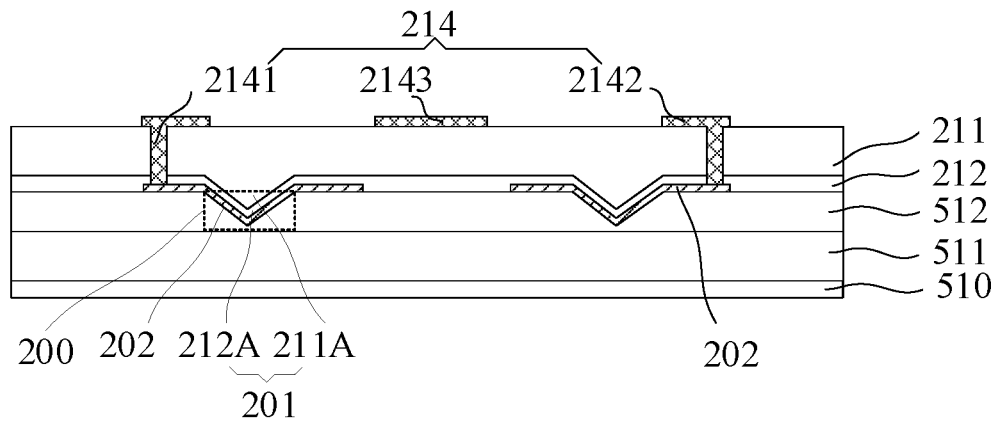

As shown in FIG. 18, the first wiring layer 214 includes a source wiring 2141 and a common electrode wiring 2142. The source wiring and the common electrode wiring are connected to the conductive portion. The first wiring layer 214 further includes a light-shielding portion 2143. The light-shielding portion 2143 is disposed between the connection structure 200 and an active layer 113. An orthographic projection of the active layer 113 on the base 500 falls within an orthographic projection of the light-shielding portion on the base 500. The light-shielding portion 2143 is configured to shield the active layer from light to prevent the light from irradiating the active layer.

In step 46, a buffer layer is formed on the first wiring layer.

As shown in FIG. 19, the buffer layer 112 is formed on the first wiring layer 214. The buffer layer 112 may be made of SiO by deposition.

In step 47, the active layer is formed on the buffer layer.

Figure 20:
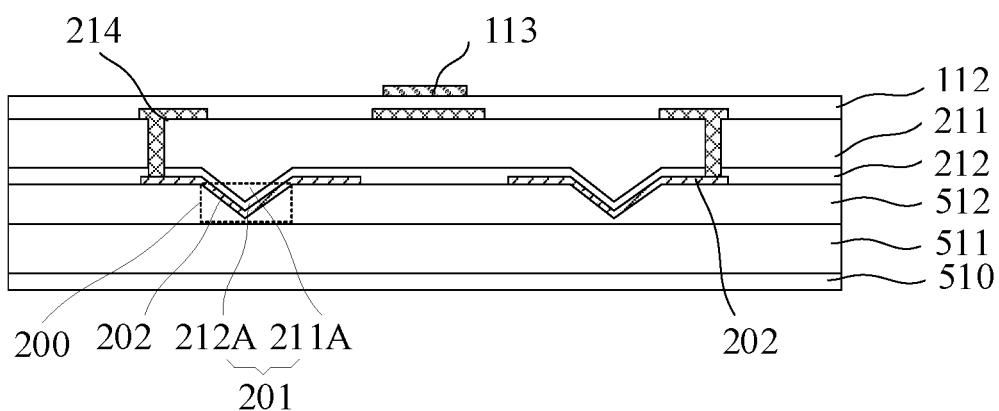

As shown in FIG. 20, the active layer 113 is formed on the butter layer 112. The active layer 113 is manufactured as follows: a-Si is deposited on the buffer layer, a-Si is subjected to an excimer laser annealing process to form p-Si, and patterning is performed finally to form the active layer 113.

In step 48, a gate insulating layer is formed on the active layer.

Figure 21:
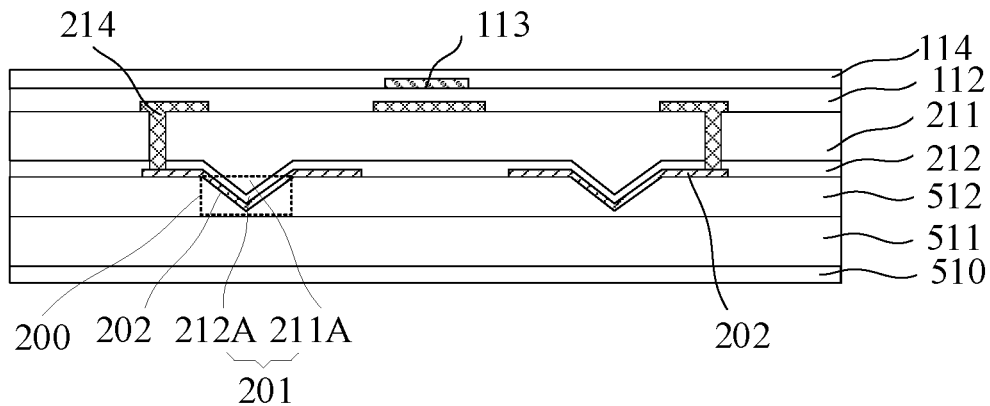

As shown in FIG. 21, the gate insulating layer 114 is formed on the active layer 113. Exemplarily, the gate insulating layer 114 may be made of SiO by deposition.

In step 49, a gate layer is formed on the gate insulating layer.

Figure 22:
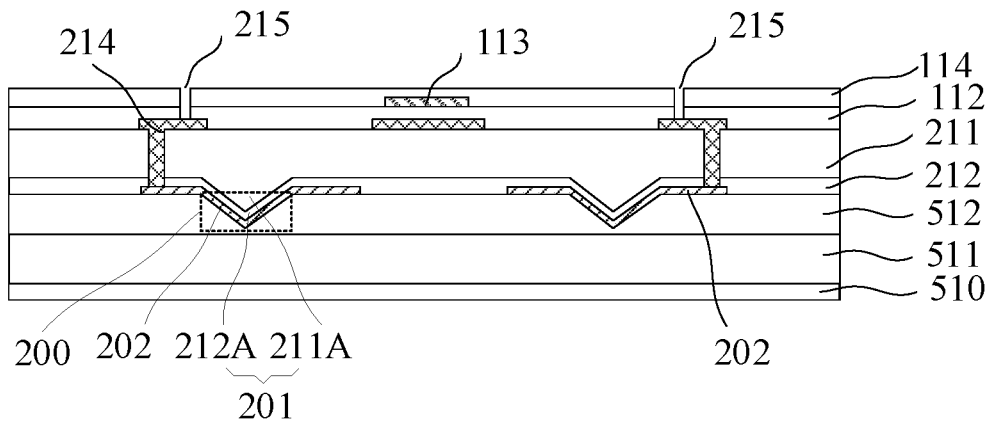
Figure 23:
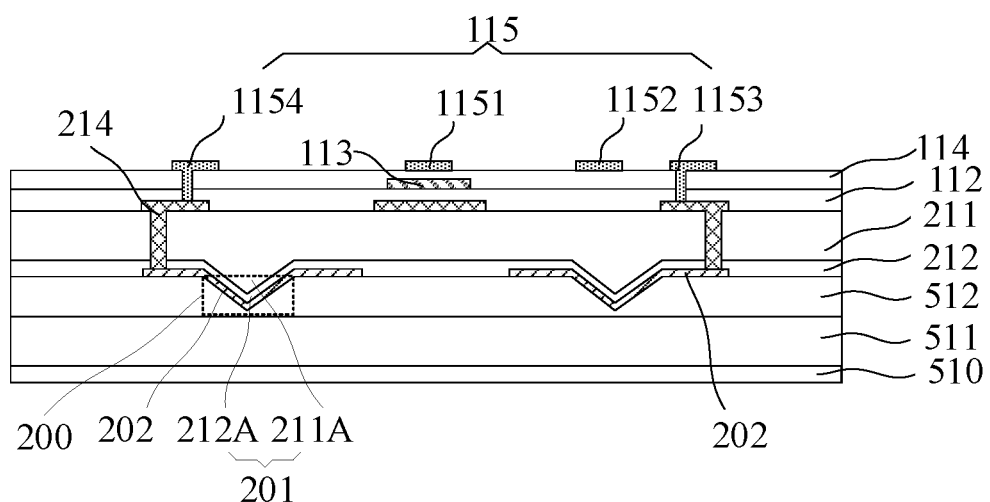

As shown in FIG. 22, a via hole 215 is formed in the gate insulating layer 114 and the buffer layer 112. As shown in FIG. 23, a layer of metal is formed on the gate insulating layer 114, for example, a layer of molybdenum (Mo), is deposited on the gate insulating layer 114 and then patterning is performed to obtain the gate layer 115. The gate layer 115 includes a gate 1151, a gate line 1152, a common electrode signal line 100B, and a source wiring 1154. The gate 1151 is connected to the gate line 1152. The common electrode signal line 100B and the source wiring 1154 are connected to the first wiring layer 214 through the via hole 215. The common electrode signal line 100B is connected to the common electrode wiring, and the source wiring 1154 is connected to the source wiring of the first wiring layer 214.

In step 50, an interlayer insulating layer is formed on the gate layer.

Figure 24:
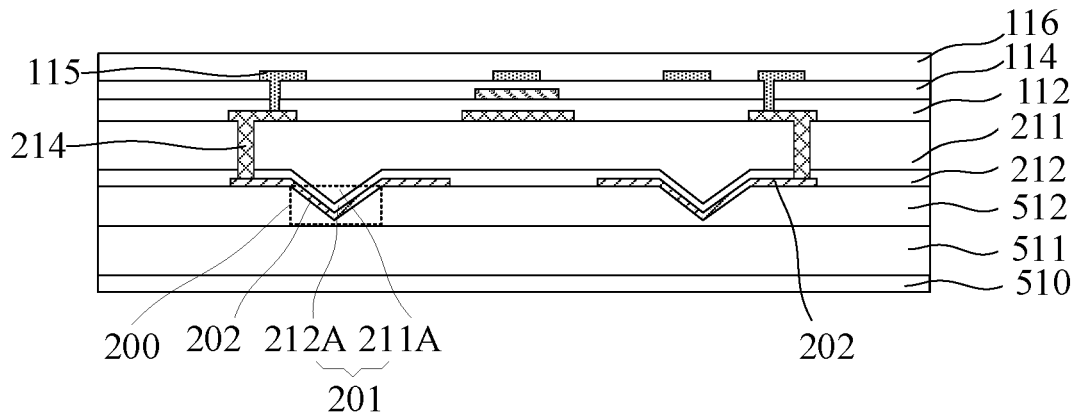

As shown in FIG. 24, the interlayer insulating layer 115 is formed on the gate layer 113. The interlayer insulating layer 116 may be a stack of a SiN sub-layer and a SiO sub-layer and may be manufactured by deposition.

In step 51, a source-drain layer is formed on the interlayer insulating layer.

Figure 25:
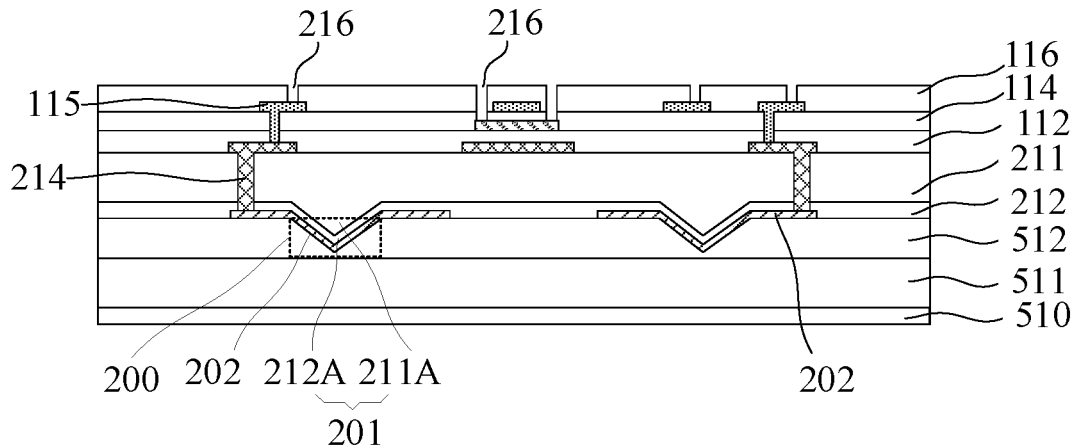
Figure 26:
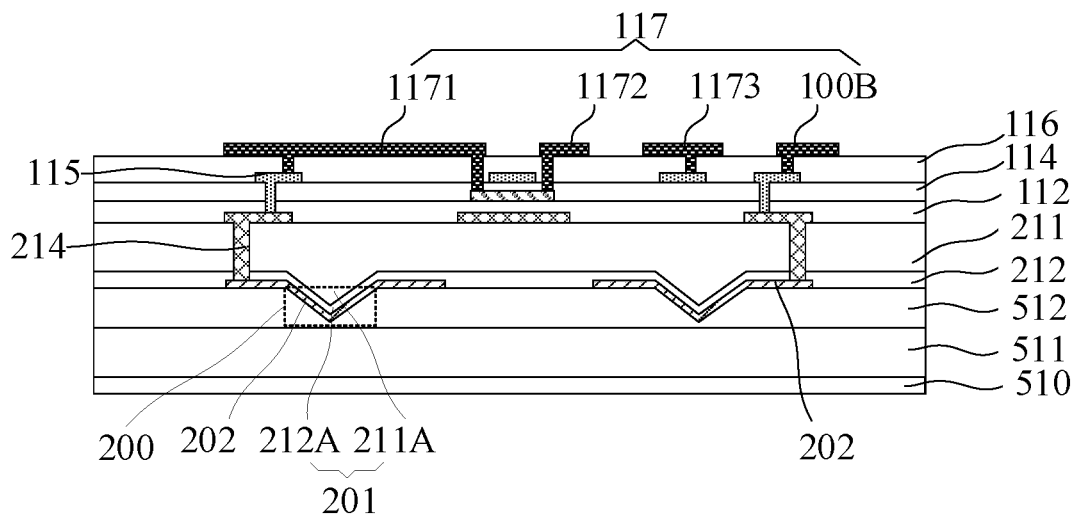

As shown in FIG. 25, a via hole 216 is formed in the interlayer insulating layer 116 and the gate insulating layer 114. As shown in FIG. 26, a layer of metal is formed on the interlayer insulating layer 116 (for example, a Ti/Al/Ti (titanium) stack is deposited on the interlayer insulating layer 116) and then patterning is performed to obtain the source-drain layer 117. The source-drain layer 117 includes a source 1171, a drain 1172, a gate wiring 1173, and a common electrode wiring 1174. The source 1171 and the drain 1172 are connected to the active layer 113. The source 1171 is also connected to the source wiring of the gate layer 115. The gate wiring 1173 is connected to the gate line of the gate layer 115, and the common electrode wiring 1174 is connected to the common electrode signal line of the gate layer 115.

In step 52, a planarization layer is formed on the source-drain layer.

Figure 27:
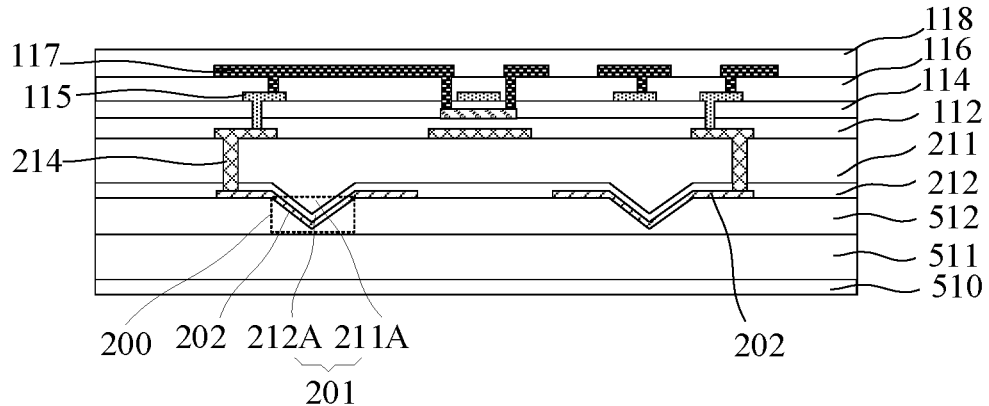

As shown in FIG. 27, a planarization layer 118 is formed on the source-drain layer 117. The planarization layer 118 may be made of SiO by deposition.

In step 53, a pad is formed on the planarization layer.

Figure 28:
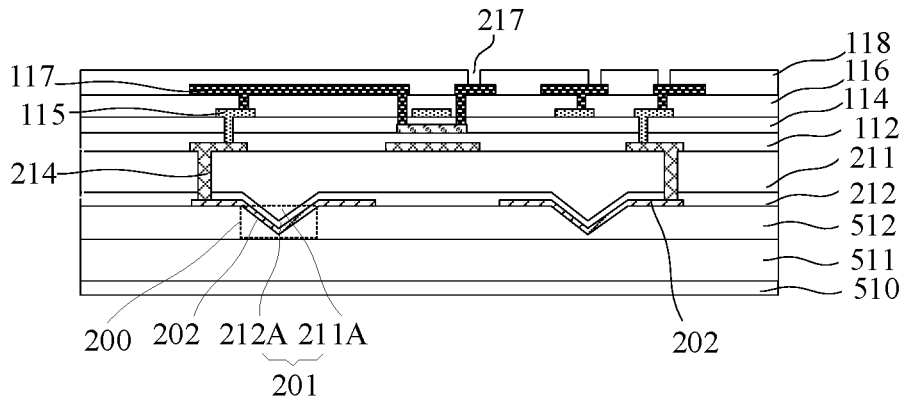
Figure 29:
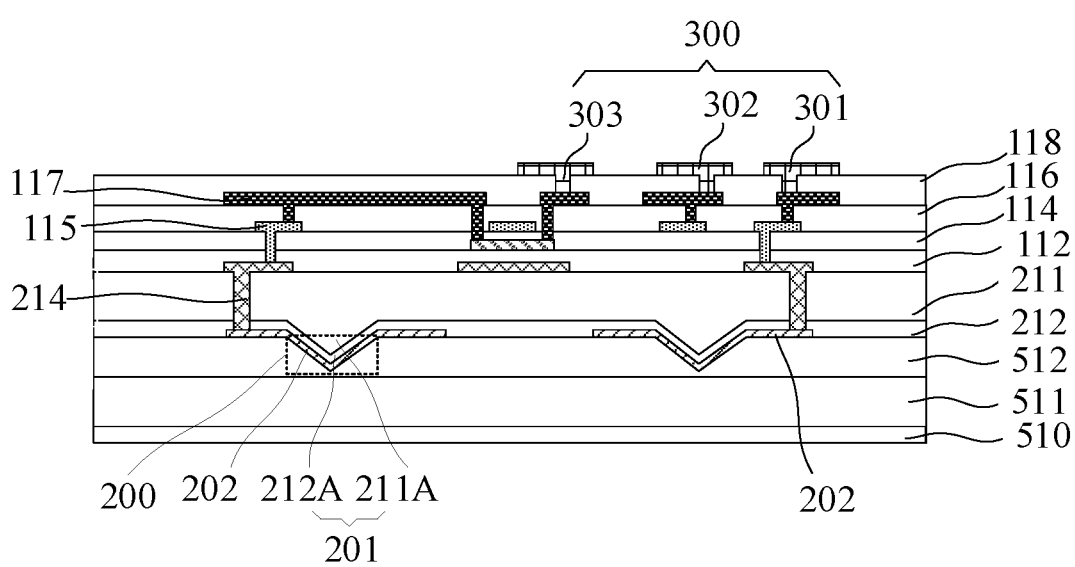

As shown in FIG. 28, a via hole 217 is formed in the planarization layer. As shown in FIG. 29, a layer of metal is formed on the planarization layer 118 (for example, a Ti/Al/Ti stack is deposited on the planarization layer) and then patterning is performed to obtain the pad 300. The pad 300 includes a common pad 301, a gate pad 302, and a data pad 303. The common pad 301 is connected to the common electrode wiring, the gate pad 302 is connected to the gate wiring, and the data pad 303 is connected to the drain.

In step 54, a package layer is formed on the pad.

A package layer 400 is formed on the pad 300 to obtain the display backplate as shown in FIG. 7. The package layer 400 may be made of a resin material and may be manufactured by coating of the resin material and solidification.

Figure 30:
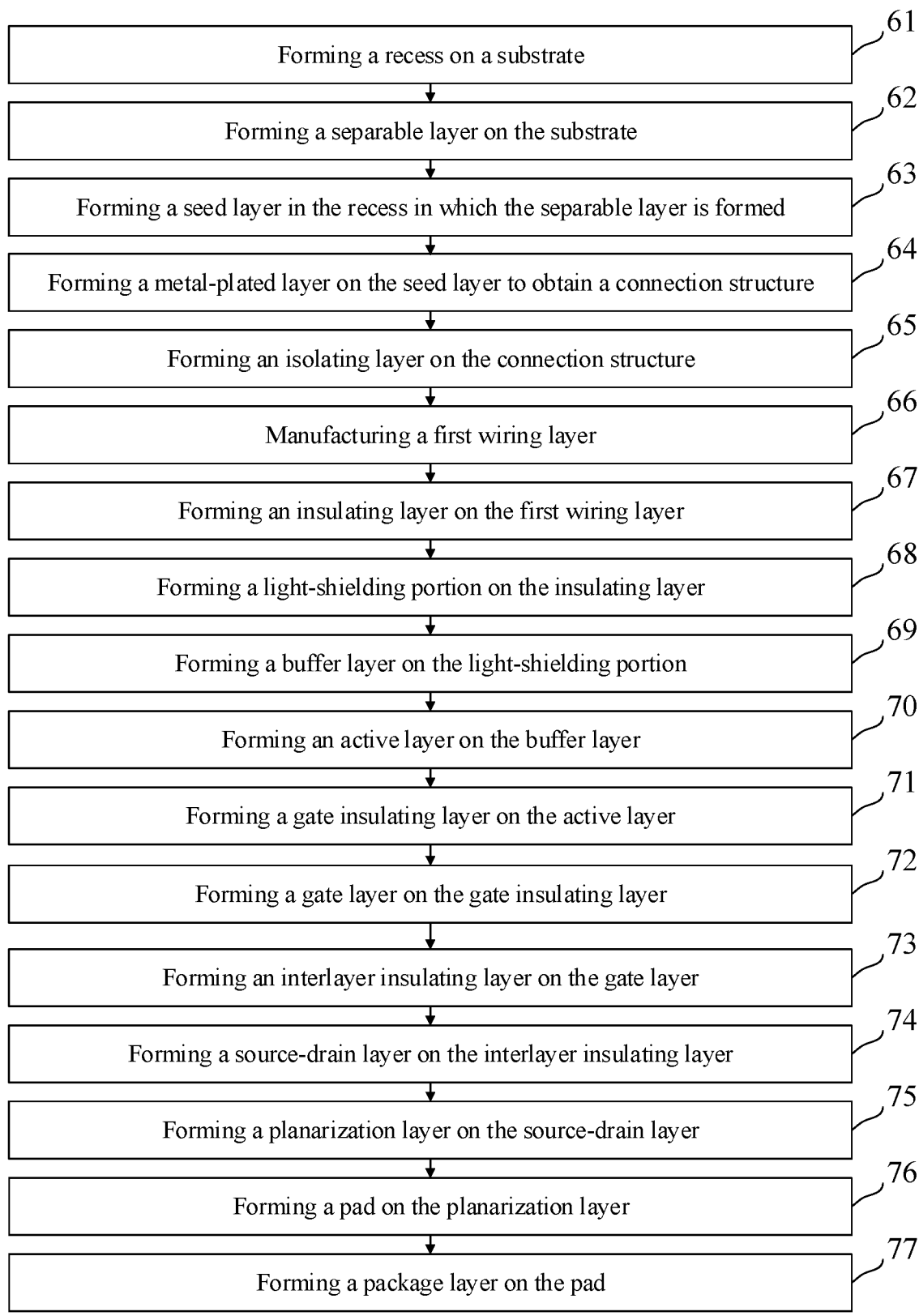
FIG. 30 is a flowchart of still another method for manufacturing a display backplate according to an embodiment of the present disclosure.

FIG. 30 is a flowchart of a further display backplate manufacturing method according to an embodiment of the present disclosure. The method is used for manufacturing the display backplate as shown in FIG. 8. With reference to FIG. 30, the method includes the following steps.

In step 61, a recess is formed in a substrate.

Figure 31:
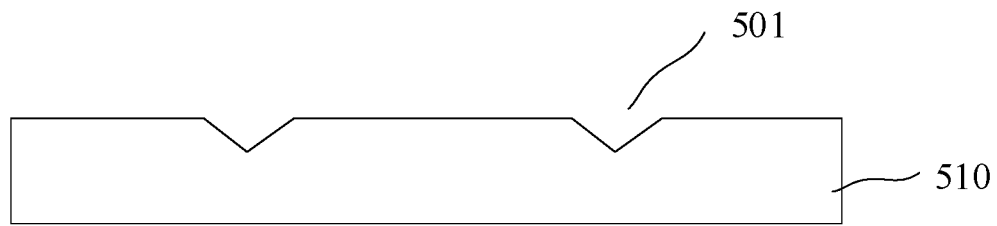
FIGS. 31 to 49 are diagrams showing processes of manufacturing the display backplate shown in FIG. 9 according to an embodiment of the present disclosure.

With reference to FIG. 31, the substrate 510 may be a glass substrate. The recess 501 is formed in the substrate 510. The recess 501 has a larger section area at the opening and a small section area at the bottom.

In the embodiment of the present disclosure, the recess 501 in the glass substrate may be manufactured as follows.

The glass substrate is irradiated with laser having a specific wavelength and a region irradiated with the laser is a region in which the recess needs to be formed. Under laser irradiation, the glass substrate is denatured. Herein, when a laser is used to irradiate the glass substrate, the laser may be controlled to move to sequentially irradiate corresponding positions in which various recesses need to be formed.

The glass substrate is etched with a hydrofluoric acid (HF). Since the hydrofluoric acid has different etching ratios for the irradiated and unirradiated regions on the glass substrate, the recesses are formed in the regions irradiated by the laser.

During etching by the hydrofluoric acid, the entire upper surface of the glass substrate has hydrofluoric acid. In the etching process, the reaction between hydrofluoric acid at the bottom and the glass substrate irradiated by the laser may continuously consume the hydrofluoric acid, and the hydrofluoric acid at the bottom is not supplemented as fast as the hydrofluoric acid at the top, such that the concentration of hydrofluoric acid at the top is higher than that of the hydrofluoric acid at the bottom. As a result, the etched opening has a large upper portion and a small lower portion. That is, the etched opening takes the shape of an inverted cone, and is the recess required by the embodiment of the present disclosure and used for manufacturing the connection structure. The shape of the recess is controlled by controlling the etching time.

In step 62, a separable layer is formed on the substrate.

Figure 32:
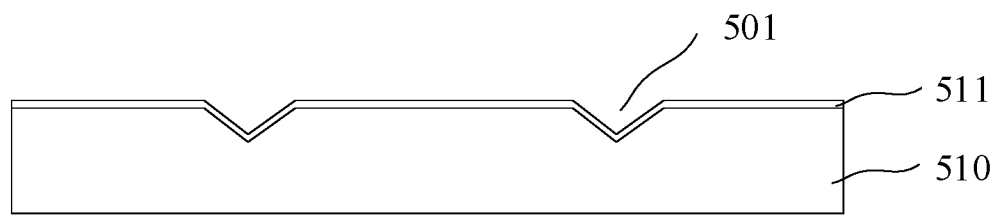

With reference to FIG. 32, the separable layer 511 is deposited on the substrate 510 in which the recess 501 is formed. The separable layer 511 may be made of GaN by deposition. The GaN separable layer 511 may have a thickness of 10 to 20 nm.

In step 63, a seed layer is formed in the recess in which the separable layer is formed.

Exemplarily, the seed layer is formed to have a thickness in the range from 1 nm to 10 nm.

Exemplarily, any metal or alloy which has a relatively high adhesion to the separable layer and a relatively good ability to prevent the metal to be electroplated from diffusing may be used as a material for manufacturing the seed layer. Examples of suitable metal materials for manufacturing the seed layer include: copper, titanium, tantalum, chromium, titanium tungsten alloy, tantalum nitride, and titanium nitride.

Figure 33:
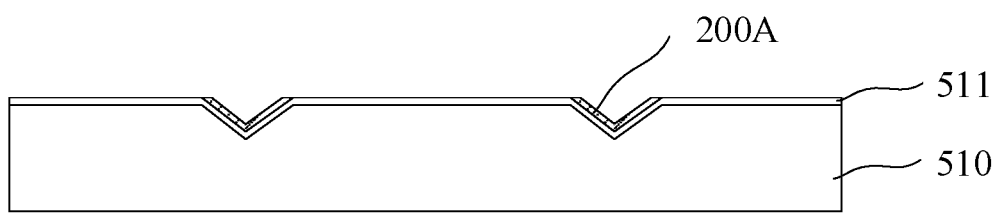

With reference to FIG. 33, the seed layer 200A is formed in the recess 501 in which the separable layer 511 is formed. The seed layer may be manufactured by deposition and patterning.

In step 64, a metal-plated layer is formed on the seed layer to obtain the connection structure.

The metal-plated layer may be made of the same material as the seed layer. Exemplarily, when the seed layer is made of copper, if the metal-plated layer is made of copper, the seed layer and the metal-plated layer finally form an integrated structure. If the seed layer is made of other materials, the seed layer and the metal-plated finally form a double-layer structure.

Figure 34:
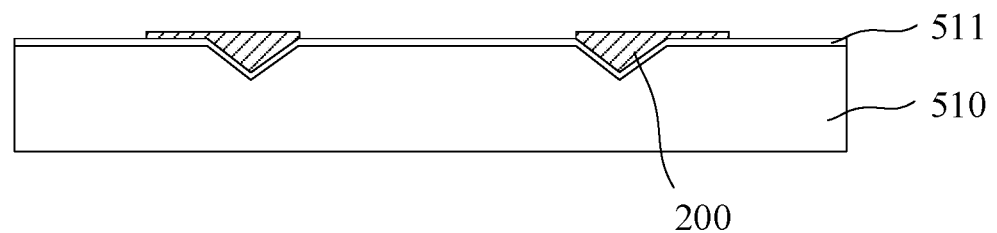

With reference to FIG. 34, electroplating is performed on the seed layer to form the metal-plated layer and the electroplated layer is patterned to obtain the connection structure 200. Herein, after completion of electroplating, it also needs to perform chemical mechanical polishing (CMP) because the flatness obtained by the electroplating is poor and the metal surface can be flattened by the CMP.

It should be noted that during the manufacturing of the connection structure, wiring connected to the connection structure is also manufactured, which facilitates connection between the wiring subsequently manufactured and the connection structure.

In step 65, an isolating layer is formed on the connection structure.

Figure 35:
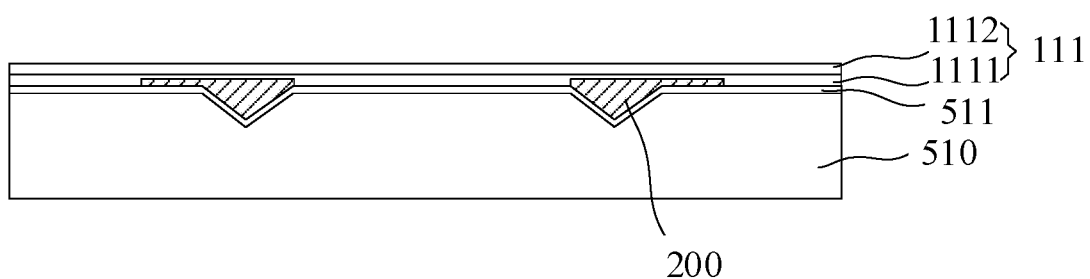

With reference to FIG. 35, the isolating layer 111 is formed on the connection structure 200. The isolating layer 111 includes an organic isolating layer 1111 and an inorganic isolating layer 1112. The organic isolating layer 1111 is disposed between the inorganic isolating layer 1112 and the connection structure 200. The inorganic isolating layer 1112 may be made of silicon oxide (SiO) and the organic isolating layer 1111 may be made of polyimide (PI). The inorganic isolating layer 1112 may be may be formed by deposition, and the organic isolating layer 1111 may be formed by coating.

In this implementation, the isolating layer 111 plays the same role as the organic insulating layer and the inorganic insulating layer in FIG. 7, both for insulation and water and oxygen erosion.

In step 66, a first wiring layer is manufactured.

Figure 36:
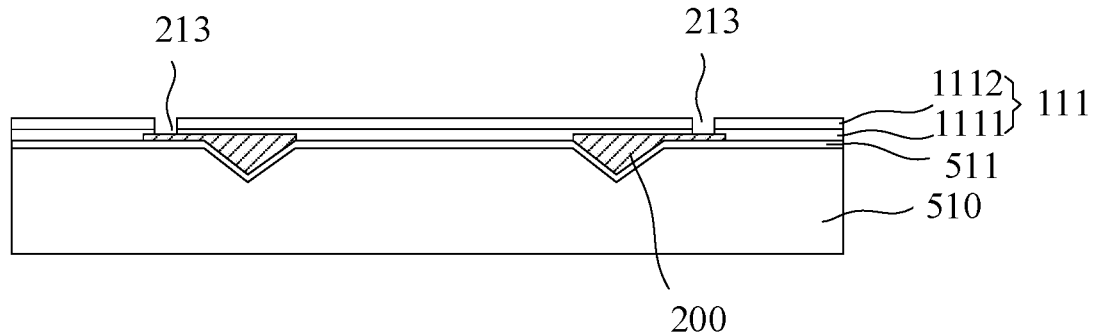
Figure 37:
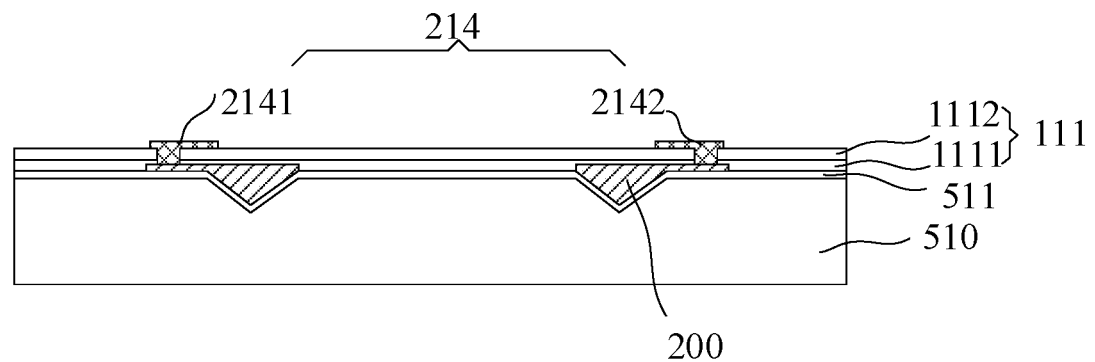

As shown in FIG. 36, a via hole is formed in the organic isolating layer 1111 and the inorganic isolating layer 1112. As shown in FIG. 37, a layer of metal, such as a layer of molybdenum (Mo), is formed on the organic isolating layer 1112 and then patterning is performed to obtain the first wiring layer 214. The first wiring layer 214 is connected to the connection structure 200 through the via hole 213.

As shown in FIG. 37, the first wiring layer 214 includes a source wiring 2141 and a common electrode wiring 2142.

Both the source wiring and the common electrode wiring are connected to the connection structure.

In step 67, an insulating layer is formed on the first wiring layer.

Figure 38:
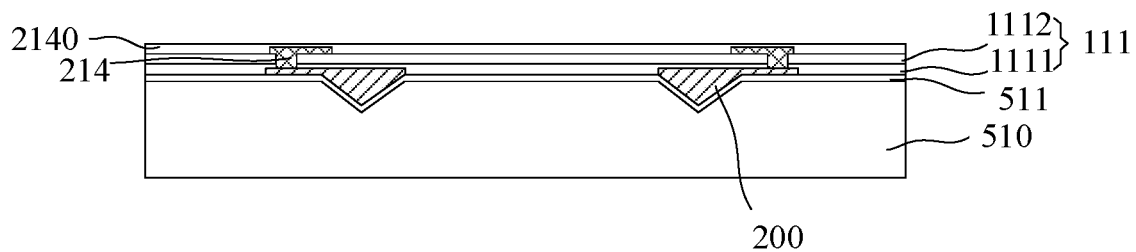

As shown in FIG. 38, the insulating layer 2140 is formed on the first wiring layer 214. The insulating layer 2140 may be made of polyimide (PI) by coating.

In step 68, a light-shielding portion is formed on the insulating layer.

Figure 39:
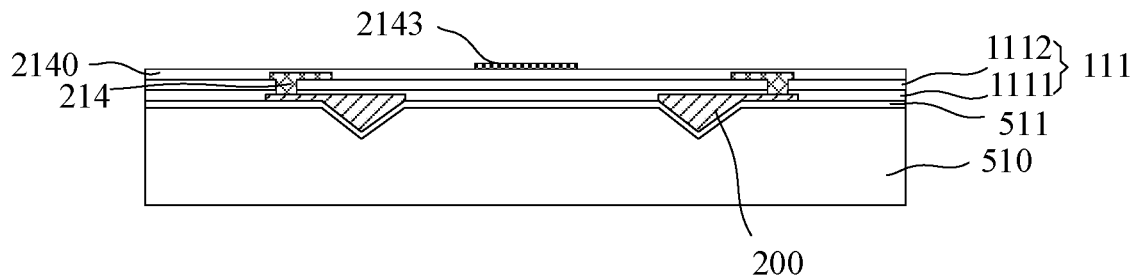

As shown in FIG. 39, the light-shielding portion 2143 is formed on the insulating layer 2140. The light-shielding portion 2143 may be made of a metal such as Mo by deposition and patterning.

In step 69, a buffer layer is formed on the light-shielding portion.

Figure 40:
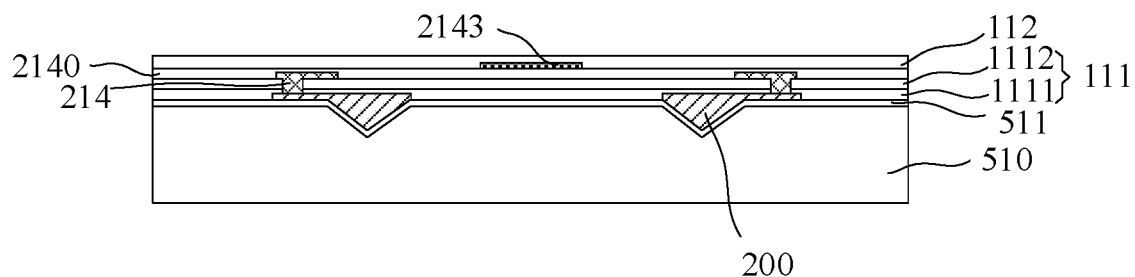

As shown in FIG. 40, the buffer layer 112 is formed on the light-shielding portion 2143. The buffer layer 112 may be made of SiO by deposition.

In step 70, an active layer is formed on the buffer layer.

Figure 41:
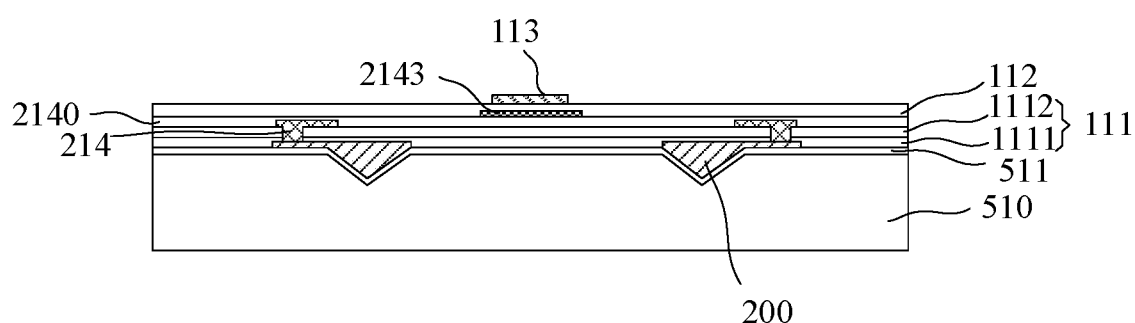

As shown in FIG. 41, the active layer 113 is formed on the butter layer 112. The active layer 113 is manufactured as follows: a-Si is deposited on the buffer layer, a-Si is subjected to an excimer laser annealing process to form p-Si, and patterning is performed finally to form the active layer 113.

In step 71, a gate insulating layer is formed on the active layer.

Figure 42:
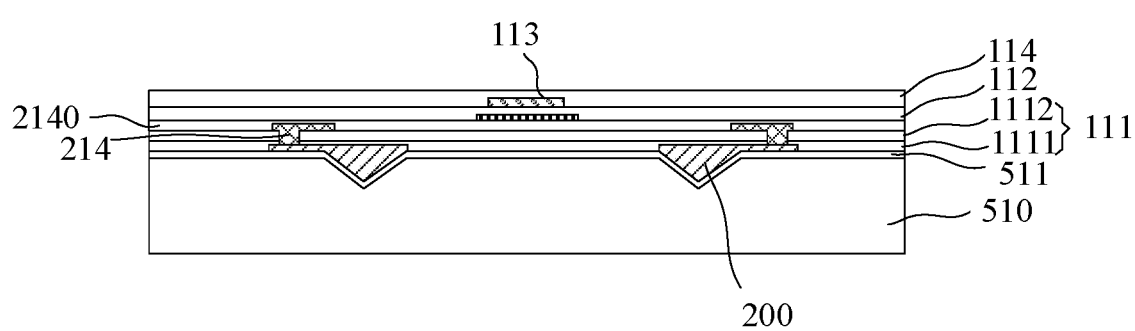

As shown in FIG. 42, the gate insulating layer 114 is formed on the active layer 113. The gate insulating layer 114 may be made of SiO by deposition.

In step 72, a gate layer is formed on the gate insulating layer.

Figure 43:
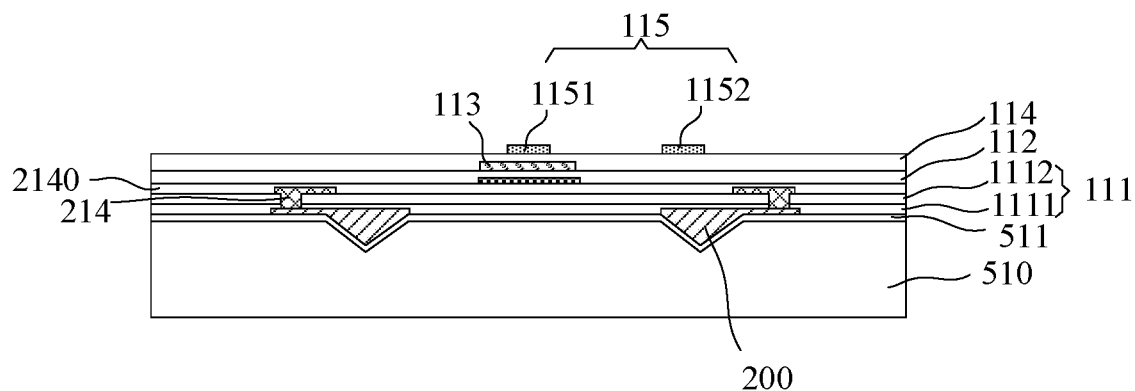

As shown in FIG. 43, a layer of metal, for example, a layer of molybdenum (Mo), is formed on the gate insulating layer 114 and then patterning is performed to obtain the gate layer 115. The gate layer 115 includes a gate 1151 and a gate line 1152. The gate 1151 is connected to the gate line 1152.

In step 73, an interlayer insulating layer is formed on the gate layer.

Figure 44:
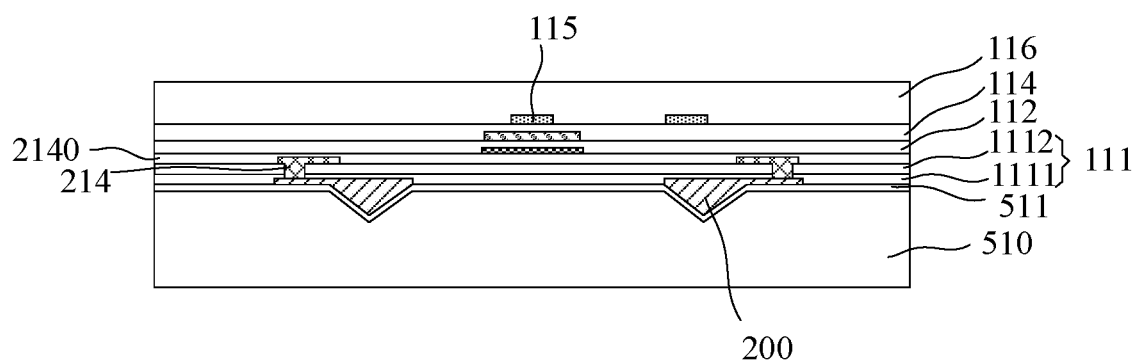

As shown in FIG. 44, the interlayer insulating layer 115 is formed on the gate layer 113. The interlayer insulating layer 116 may be a stack of a SiN sub-layer and a SiO sub-layer, and may be manufactured by deposition.

In step 74, a source-drain layer is formed on the interlayer insulating layer.

Figure 45:
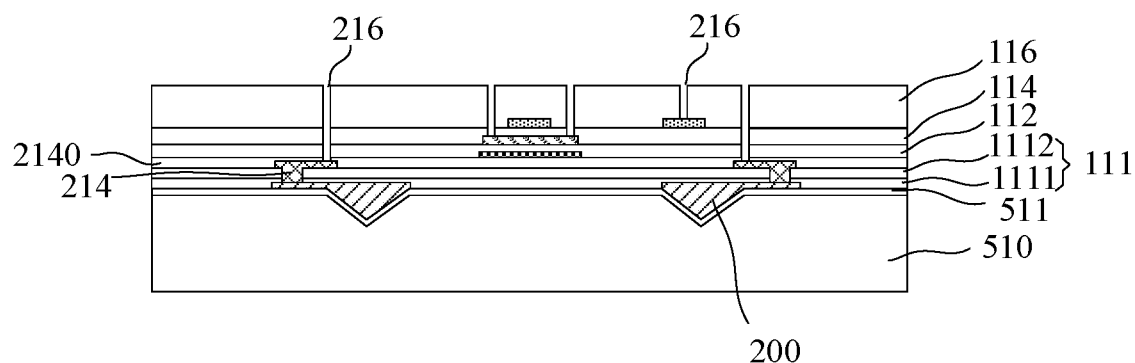
Figure 46:
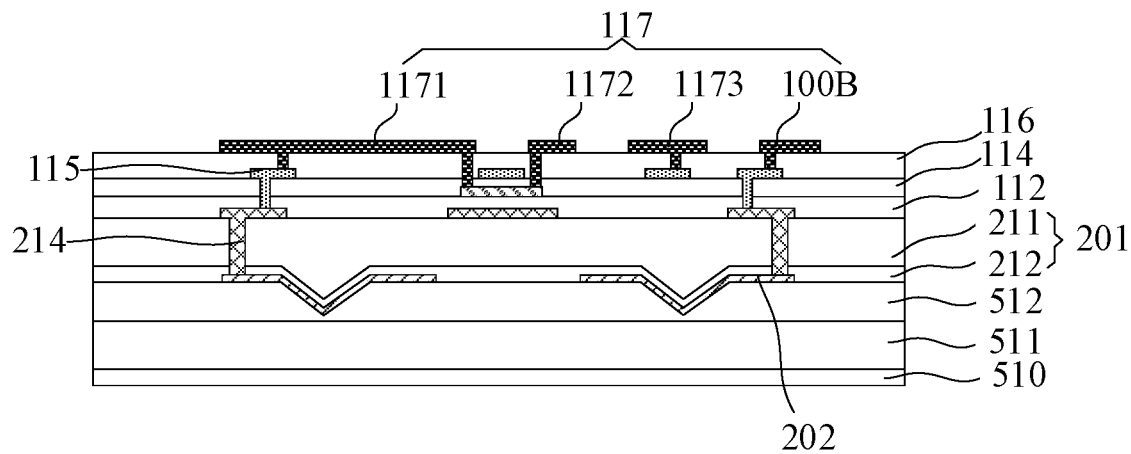

As shown in FIG. 45, a via hole 216 is formed in the interlayer insulating layer 116 and the gate insulating layer 114. As shown in FIG. 46, a layer of metal is formed on the interlayer insulating layer 116 (for example, a Ti/Al/Ti stack is deposited on the interlayer insulating layer 116) and then patterning is performed to obtain the source-drain layer 117. The source-drain layer 117 includes a source 1171, a drain 1172, gate wiring 1173, and a common electrode signal line 100B. The source 1171 and the drain 1172 are connected to the active layer 113. The source 1171 is also connected to the source wiring of the first wiring layer 214. The gate wiring 1173 is connected to the gate line of the gate layer 115, and the common electrode signal line 100B is connected to the common electrode wiring of the first wiring layer 214.

In step 75, a planarization layer is formed on the source-drain layer.

Figure 47:
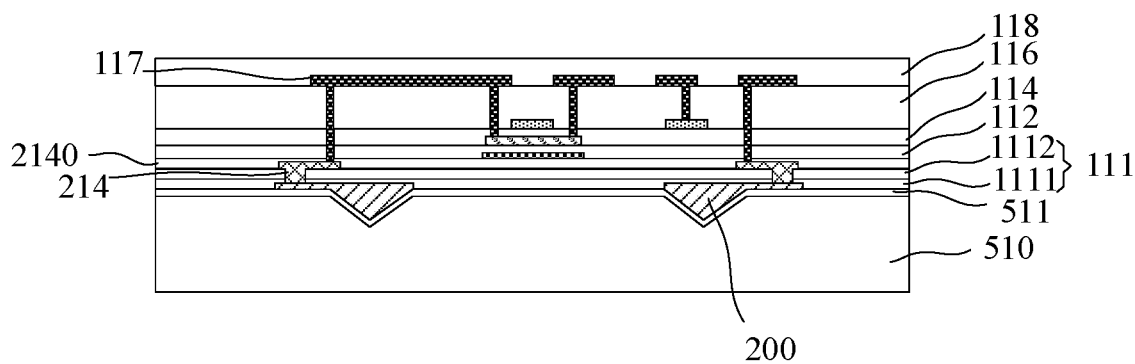

As shown in FIG. 47, the planarization layer 118 is formed on the source-drain layer 117. The planarization layer 118 may be made of SiO by deposition.

In step 76, a pad is formed on the planarization layer.

Figure 48:
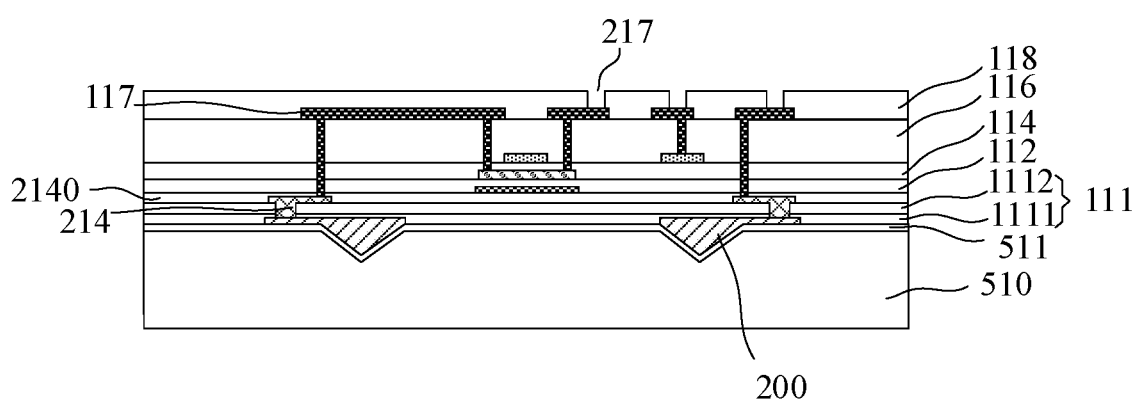
Figure 49:
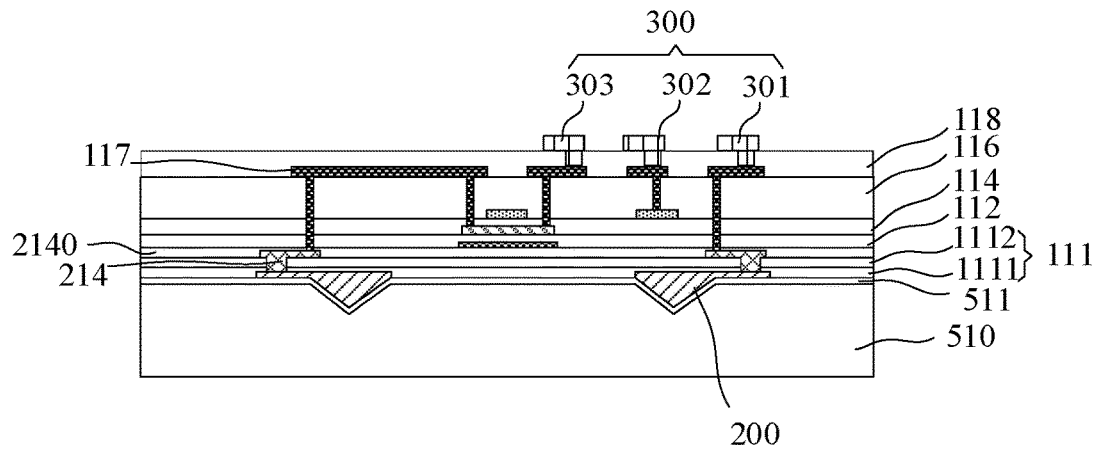

As shown in FIG. 48, a via hole 217 is formed in the planarization layer 118. With reference to FIG. 49, a layer of metal is formed on the planarization layer 118 (for example, a Ti/Al/Ti stack is deposited on the planarization layer) and then patterning is performed to obtain the pad 300. The pad 300 includes a common pad 301, a gate pad 302, and a data pad 303. The common pad 301 is connected to the common electrode wiring, the gate pad 302 is connected to the gate wiring, and the data pad 303 is connected to the drain.

In step 77, a package layer is formed on the pad.

The package layer 400 is formed on the pad 300 to obtain the display backplate as shown in FIG. 8. The package layer 400 may be made of a resin material and manufactured by coating of the resin material and solidification.

Figure 50:
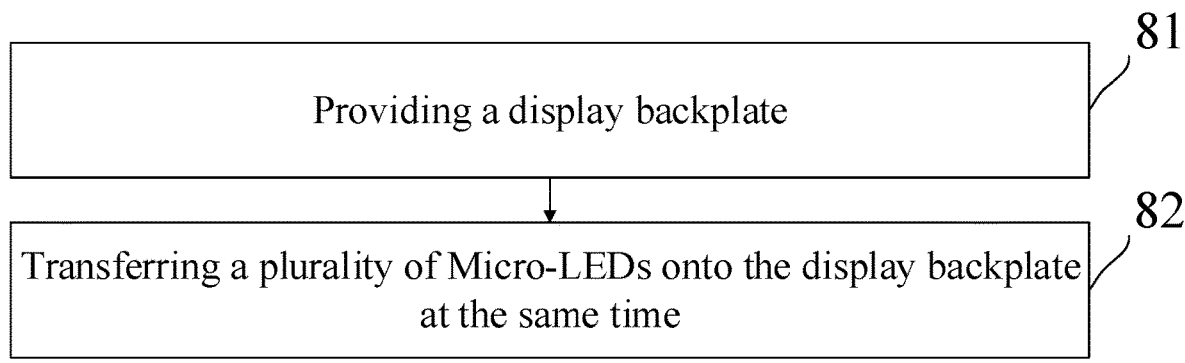
FIG. 50 is a flowchart of a method for manufacturing a display panel according to an embodiment of the present disclosure.

FIG. 50 is a flowchart of a display panel manufacturing method according to an embodiment of the present disclosure. With reference to FIG. 50, the method includes the following steps.

In step 81, a display backplate is provided.

The display backplate may be the display backplate as shown in any one of FIGS. 1 to 8.

If the display backplate as shown in FIG. 9 or 10 is provided, the method further includes: the base is removed.

If the display backplate as shown in FIG. 9 is provided and the separable layer 511 is made of an organic resin material, the process of removing the base includes the following steps.

Figure 51:
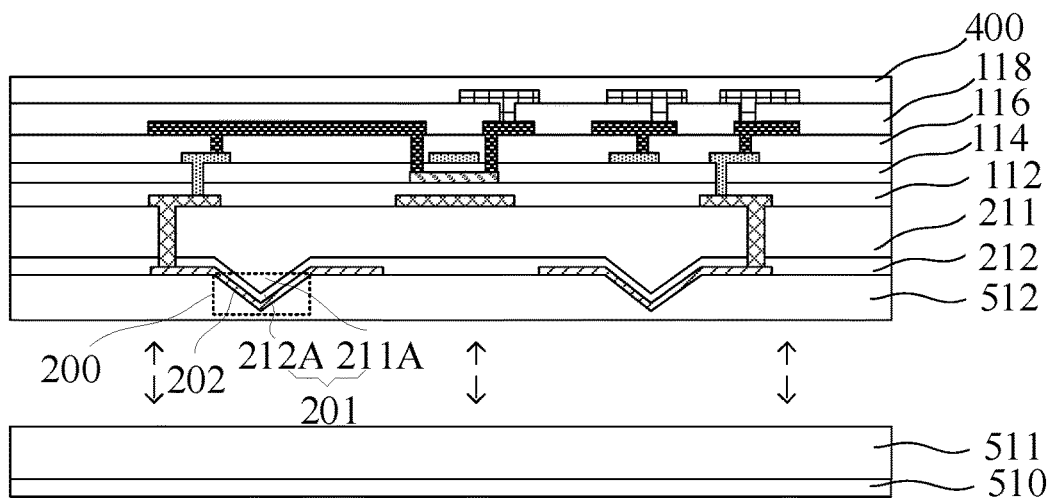
FIGS. 51 to 57 are diagrams showing processes of manufacturing the display panel according to an embodiment of the present disclosure.
Figure 52:
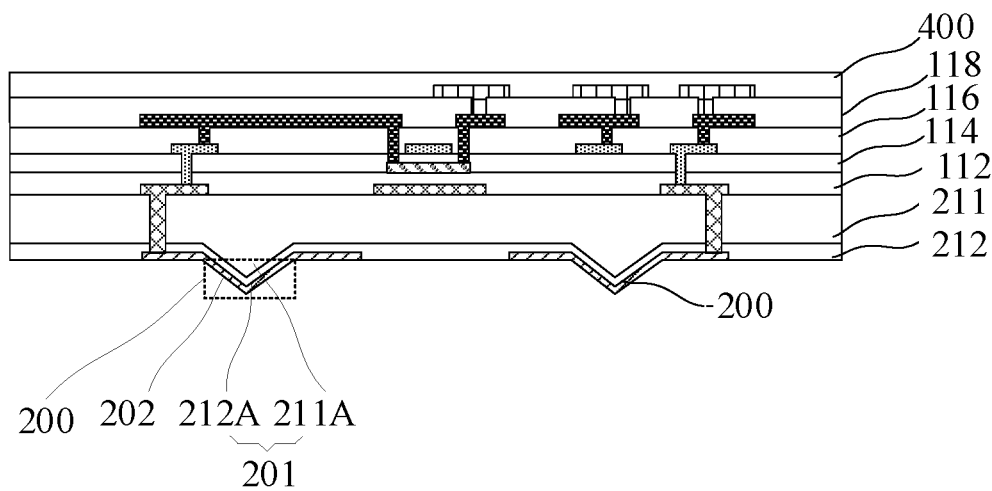

As shown in FIG. 51, the substrate 510 and the separable layer 511 are separated from the organic resin layer 512 with a mechanical force. As shown in FIG. 52, the resin layer 512 may be removed by dry etching to expose the connection structure 200.

When the display backplate as shown in FIG. 8 is provided and the separable layer 511 is made of GaN, the process of removing the base includes the following steps.

Figure 53:
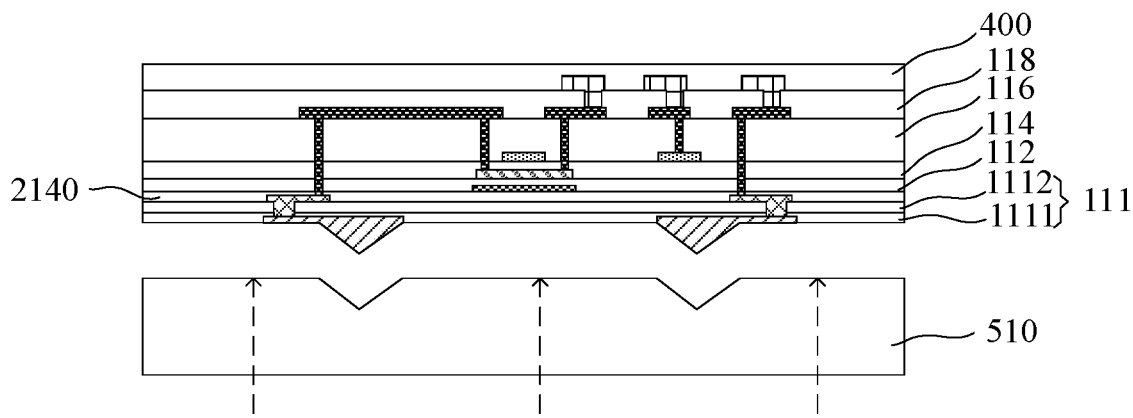

As shown in FIG. 53, laser irradiation is performed to decompose the separable layer 511, such that the substrate 510 is separated from the connection structure 200. The laser wavelength may be 266 nm, and GaN is decomposed into Ga and $N_2$ under laser irradiation, such that the connection structure is separated from the substrate.

In step 82, a plurality of micro-LEDs is transferred onto the display backplate at the same time, wherein any one of the plurality of micro-LED includes a first electrode and a second electrode which are respectively connected to a pair of connection structures.

In the embodiment of the present disclosure, the step that the plurality of micro-LEDs is transferred onto the display backplate at the same time includes the following steps.

The display backplate is coated with a layer of resin material doped with a solvent.

The plurality of micro-LEDs is transferred onto the display backplate at the same time with a mass transferring technique, wherein the first electrode and the second electrode of the micro-LED are in contact with the connection structures. At this time, the first electrode and the second electrode of the micro-LED enter the resin material and correspond to the connection structure. Exemplarily, the connection structure connected to the common electrode signal line is connected to an N electrode of the micro-LED and the connection structure connected to the thin-film transistor is connected to a P electrode of the micro-LED.

The resin material is heated to solidify the resin material. As the resin material is doped with the solvent, the solvent evaporates during heating. As a result, the resin material is solidified.

Herein, the temperature of heating for solidification may be 140 degrees Celsius.

Herein, the mass transferring technique refers to transferring a large number of micro-LEDs onto the display backplate at the same time by means of vacuum, static electricity, adhering and the like. In the above process, the surface of the display backplate with the connection structure face upwards for facilitating bonding to the micro-LED. After the display backplate is coated with the resin material, the resin material will overflow around when the micro-LED is transferred onto and bound to the display backplate. Specifically, when the micro-LED is transferred onto the display backplate, the micro-LED needs to be submerged into the resin material by certain pressure, such that the first electrode and the second electrode of the micro-LED are in contact with the tops of the connection structures. The immersion of the micro-LED will cause the resin material to overflow around. After the first electrode and the second electrode of the micro-LED are in contact with the tops of the connection structures, the resin material is solidified by heating. When the resin material is solidified, the surface tension may drive the micro-LED to press downwards. At the top of the connection structure, due to the downward pressure of the micro-LED, the top of the connection structure punctures the resin material wrapping the top of the connection structure, thereby achieving the electrical connection between the micro-LED and the display backplate. In addition, when the material hardness of the first electrode and the second electrode is relatively smaller, the top of the connection structure finally pierces into the electrode under the above tension, thereby further ensuring the electrical connection between the Micro-LED and the display backplate. The solidification of the resin material also ensures the secure connection.

Figure 54:
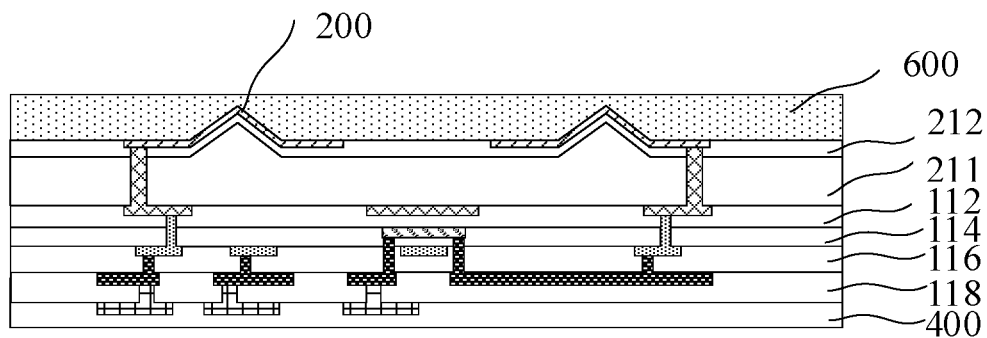
Figure 55:
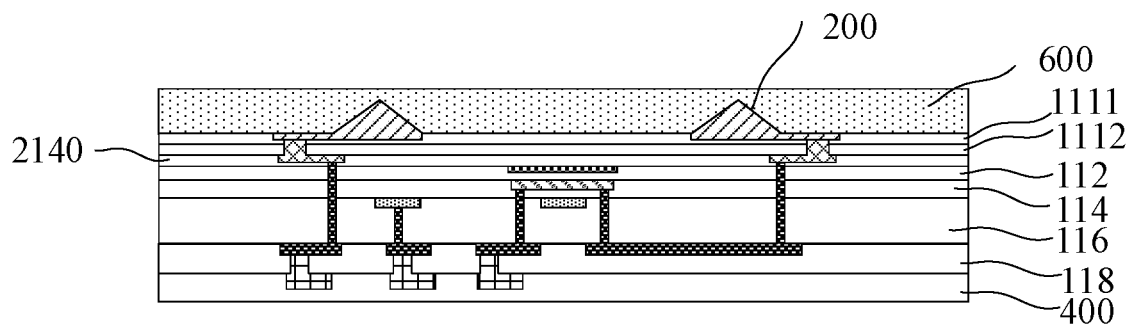
Figure 56:
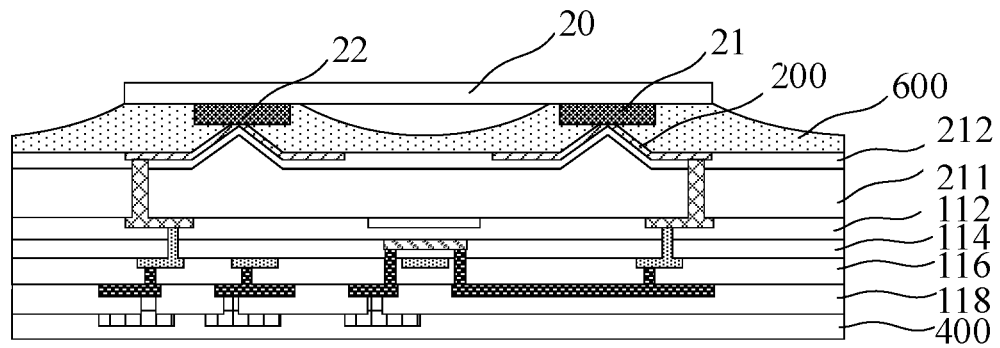
Figure 57:
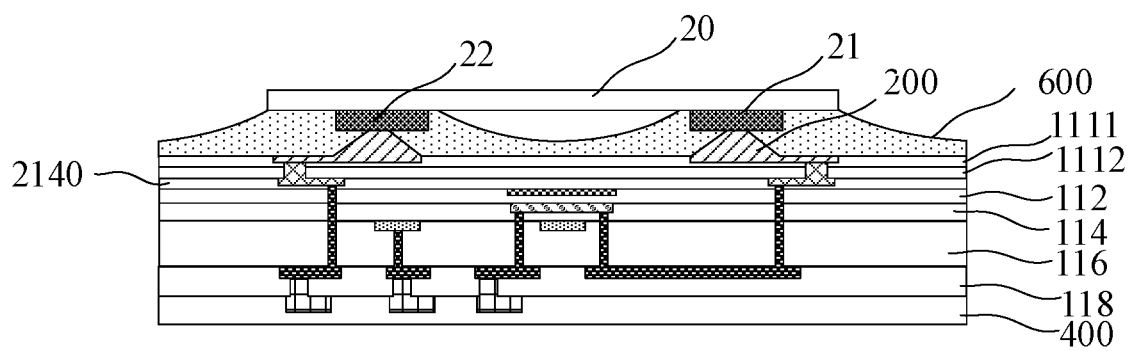

As shown in FIG. 54 (corresponding to the structure in FIG. 7) and FIG. 55 (corresponding to the structure in FIG. 8), the connection structure 200 is coated with a resin material layer 600. The micro-LED 20 is then transferred onto the resin material layer 600, wherein the first electrode 21 and the second electrode 22 of the micro-LED are in contact with the connection structures 200. The resin material layer 600 is then heated to obtain the display panels shown in FIG. 56 (corresponding to the structure in FIG. 7) and FIG. 57 (corresponding to the structure in FIG. 8).

In this implementation, since the resin material is doped with the solvent, the heating may cause evaporation of the solvent, thereby causing the resin material to shrink due to heating. The pressure of the shrinkage results in secure electrical connection between the first electrode and the second electrode of the micro-LED, and the connection structures.

After the above processes of manufacturing the display panel according to the present disclosure are completed, the package layer on the display backplate may also be removed (for example, by $O_2$ plasma etching) to expose the pad on the display backplate. The pad is bonded to the driving IC and the like, such that the assembly of the display panel and the driving circuit is completed.

In the embodiment of the present disclosure, the micro-LED and the IC are bonded to two surfaces of the display backplate. In this case, the display panel may achieve an ultra-narrow frame, and a plurality of display panels may be spliced to form a giant screen to achieve seamless splicing.

Other embodiments of the present disclosure may be apparent to those skilled in the art from consideration of the specification and practice of the present disclosure. This application is intended to cover any variations, uses, or adaptations of the present disclosure following the general principles thereof and including common knowledge or commonly used technical means which are not disclosed herein. The specification and embodiments are considered to be exemplary ones only, and the scope and spirit of the present disclosure are subject to the appended claims.

The present disclosure is not limited to the exact construction that has been described above and illustrated in the accompanying drawings, and that various modifications and changes may be made without departing from the scope thereof. The scope of the present disclosure is only subject to the appended claims.

What is claimed is:

1. A display backplate, comprising:
an array substrate and a plurality of pairs of connection structures on a surface of the array substrate; wherein the array substrate comprises a plurality of thin-film transistors and a common electrode signal line, wherein at least one of the plurality of thin-film transistors is connected to one of a pair of connection structures, and the common electrode signal line is connected to the other of the pair of the connection structures; and
an area of a first section of the connection structure is negatively correlated with a distance between the first section and the surface of the array substrate, and the first section is parallel to the surface of the array substrate,
wherein the display backplate further comprises a base disposed on the surface of the array substrate, wherein the base comprises recesses in one-to-one correspondence with the connection structures; an area of a second section of the recess is negatively correlated with a distance between the second section and the surface of the array substrate; the second section is parallel to the surface of the array substrate; and the connection structure is inside the corresponding recess.

2. The display backplate according to claim 1, wherein the connection structure comprises a main body portion and a conductive portion, wherein the conductive portion is disposed on a surface of the main body portion distal from the array substrate;
an orthographic projection of the main body portion on the array substrate falls within an orthographic projection of the conductive portion on the array substrate;
the conductive portion is conformal to the surface of the main body portion distal from the array substrate; and
the main body portion is made of an insulating material.

3. The display backplate according to claim 2, wherein a difference between thicknesses of the conductive portion at any positions is less than a predetermined value, and/or the conductive portion is made of any one or an alloy of copper and aluminum.

4. The display backplate according to claim 2, wherein the main body portion comprises an organic insulating portion and an inorganic insulating portion, wherein the inorganic insulating portion is disposed between the organic insulating portion and the conductive portion.

5. The display backplate according to claim 1, wherein a maximum distance between the connection structure and the array substrate is in the range of between 3 micrometers and 5 micrometers, and/or the connection structure is made of any one or an alloy of copper and aluminum.

6. The display backplate according to claim 1, wherein the connection structure is disposed on a first side of the array substrate; the display backplate further comprises a pad disposed on a second side of the array substrate; and the second side is opposite to the first side.

7. The display backplate according to claim 6, further comprising a package layer, wherein the pad is disposed between the array substrate and the package layer.

8. The display backplate according to claim 1, wherein the base comprises a substrate, a separable layer, and a resin layer which are sequentially stacked, and the recess is disposed in the resin layer, optionally, the separable layer is made of any one of an organic resin material and GaN.

9. The display backplate according to claim 1, wherein the base comprises a substrate, the recess is disposed in the substrate, and the display backplate further comprises a separable layer disposed between the base and the connection structure, optionally, the separable layer is made of any one of an organic resin material and GaN.

10. A method for manufacturing a display device, comprising:
providing the display backplate as defined in claim 1; and
transferring a plurality of micro light-emitting diodes onto the display backplate at the same time, wherein any one of the plurality of micro light-emitting diodes comprises a first electrode and a second electrode, wherein the first electrode and the second electrode are respectively connected to a pair of connection structures.

11. The method according to claim 10, wherein transferring the plurality of micro light-emitting diodes onto the display backplate at the same time comprises:
coating the display backplate with a layer of resin material doped with a solvent;
transferring the plurality of micro light-emitting diodes onto the resin material with a mass transferring technique, wherein the first electrode and the second electrode of the micro light-emitting diode are in contact with the connection structures; and
heating the resin material to solidify the resin material, such that the first electrode and the second electrode of the micro light-emitting diode are connected to the connection structures.

12. A display device, comprising:
a display backplate and a plurality of micro light-emitting diodes on the display backplate, wherein any one of the plurality of micro light-emitting diodes comprises a first electrode and a second electrode, wherein the first electrode and the second electrode are respectively connected to a pair of connection structures,
wherein the display backplate comprises:
an array substrate and a plurality of pairs of connection structures on a surface of the array substrate; wherein
the array substrate comprises a plurality of thin-film transistors and a common electrode signal line, wherein at least one of the plurality of thin-film transistors is connected to one of a pair of connection structures, and the common electrode signal line is connected to the other of the pair of the connection structures; and
an area of a first section of the connection structure is negatively correlated with a distance between the first section and the surface of the array substrate, and the first section is parallel to the surface of the array substrate,
wherein the plurality of pairs of connection structures are formed by: providing a base; forming a recess on one side of the base; and forming the connection structure at least in the recess, wherein an area of a second section of the recess is negatively correlated with a distance between the second section and the surface of the array substrate, and the second section is parallel to the surface of the array substrate.

13. The display device according to claim 12, wherein a material hardness of the connection structure is greater than a material hardness of the first electrode and the second electrode.

14. The display device according to claim 12, wherein a surface, in contact with the connection structure, of the first electrode or the second electrode is provided with a protrusion surrounding the connection structure.

15. A method for manufacturing a display backplate, comprising:
forming a plurality of pairs of connection structures; and
forming an array substrate, on a surface of which the plurality of pairs of connection structures are disposed, wherein the array substrate comprises a plurality of thin-film transistors and a common electrode signal line, wherein at least one of the plurality of thin-film transistors is connected to one of a pair of connection structures and the common electrode signal line is connected to the other of the pair of connection structures; and
an area of a first section of the connection structure is negatively correlated with a distance between the first section and the surface of the array substrate, and the first section is parallel to the surface of the array substrate,
wherein forming the plurality of pairs of connection structures comprises:
providing a base;
forming a recess on one side of the base, wherein an area of a second section of the recess is negatively correlated with a distance between the second section and the surface of the array substrate, and the second section is parallel to the surface of the array substrate; and
forming the connection structure at least in the recess.

16. The method according to claim 15, wherein forming the connection structure at least in the recess comprises:
forming a seed layer in the recess; and
forming a metal-plated layer on the seed layer.

17. The method according to claim 15, wherein forming the connection structure at least in the recess comprises:
sequentially forming a conductive portion and a main body portion in the recess, wherein
an orthographic projection of the main body portion on the array substrate falls within an orthographic projection of the conductive portion on the array substrate;
the conductive portion is conformal to a surface of the main body portion distal from the array substrate; and
the main body portion is made of an insulating material.

18. The method according to claim 15, further comprising:
removing the base.

* * * * *